(12) United States Patent
Platzgummer

(10) Patent No.: US 9,099,277 B2
(45) Date of Patent: Aug. 4, 2015

(54) PATTERN DEFINITION DEVICE HAVING MULTIPLE BLANKING ARRAYS

(71) Applicant: IMS Nanofabrication AG, Vienna (AT)

(72) Inventor: Elmar Platzgummer, Vienna (AT)

(73) Assignee: IMS Nanofabrication AG, Vienna (AT)

(*) Notice: Subject to any disclaimer, the term of this patent is extended or adjusted under 35 U.S.C. 154(b) by 0 days.

(21) Appl. No.: 14/334,274

(22) Filed: Jul. 17, 2014

(65) Prior Publication Data
US 2015/0021493 A1    Jan. 22, 2015

(30) Foreign Application Priority Data
Jul. 17, 2013   (EP) .................................... 13176834

(51) Int. Cl.
*H01J 37/04* (2006.01)
*H01J 37/147* (2006.01)
*H01J 37/317* (2006.01)

(52) U.S. Cl.
CPC ............. *H01J 37/045* (2013.01); *H01J 37/147* (2013.01); *H01J 37/3177* (2013.01); *H01J 2237/0435* (2013.01)

(58) Field of Classification Search
USPC ......................................... 250/396 R, 492.22
See application file for complete search history.

(56) References Cited

U.S. PATENT DOCUMENTS

| | | | |
|---|---|---|---|
| 1,033,741 A | 7/1912 | Sims | |
| 1,420,104 A | 6/1922 | Howe et al. | |
| 1,903,005 A | 3/1933 | McCuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,735,881 A | 4/1988 | Kobayashi et al. | |

(Continued)

FOREIGN PATENT DOCUMENTS

| | | |
|---|---|---|
| CN | 202204836 U | 4/2012 |
| EP | 1033741 A2 | 9/2000 |

(Continued)

OTHER PUBLICATIONS

European Search Report for Application No. 09450211.9-1226, Report Dated Sep. 14, 2010, 4 pgs.

(Continued)

*Primary Examiner* — Kiet T Nguyen
(74) *Attorney, Agent, or Firm* — KPPB LLP

(57) ABSTRACT

A pattern definition (PD) device for use in a charged-particle multi-beam processing or inspection apparatus includes at least two deflection array devices positioned in a stacked arrangement. A particle beam (Ib) traversing the PD device is formed into a plurality of beamlets, which can be deflected or blanked by the two deflection array devices. Each deflection array device comprises a plurality of blanking openings allowing passage of beamlets, and a plurality of deflecting devices, each deflecting device being associated with a respective blanking opening and comprising an electrostatic electrode. The deflecting devices are selectively activatable and configured to influence, when activated, the beamlets traversing said respective blanking openings so as to deflect said beamlets off their nominal paths. Each deflection array device is configured to act on only respective subsets of beamlets by selectively deflecting them, while allowing the other beamlets to traverse the respective deflection array device without deflection.

12 Claims, 14 Drawing Sheets

(56) References Cited

U.S. PATENT DOCUMENTS

| | | | |
|---|---|---|---|
| 5,103,101 A | 4/1992 | Berglund et al. |
| 5,260,579 A | 11/1993 | Yasuda et al. |
| 5,369,282 A | 11/1994 | Arai et al. |
| 5,399,872 A | 3/1995 | Yasuda et al. |
| 5,814,423 A | 9/1998 | Maruyama et al. |
| 5,841,145 A | 11/1998 | Satoh et al. |
| 5,857,815 A | 1/1999 | Bailey et al. |
| 5,876,902 A | 3/1999 | Veneklasen et al. |
| 6,014,200 A | 1/2000 | Sogard et al. |
| 6,043,496 A | 3/2000 | Tennant |
| 6,049,085 A | 4/2000 | Ema |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley et al. |
| 6,252,339 B1 | 6/2001 | Kendall |
| 6,280,798 B1 | 8/2001 | Ring et al. |
| 6,333,138 B1 | 12/2001 | Higashikawa et al. |
| 6,473,237 B2 | 10/2002 | Mei |
| 6,767,125 B2 | 7/2004 | Midas et al. |
| 6,768,123 B2 | 7/2004 | Giering |
| 6,768,125 B2 | 7/2004 | Platzgummer et al. |
| 6,858,118 B2 | 2/2005 | Platzgummer et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,201,213 B2 | 4/2007 | Leeson et al. |
| 7,214,951 B2 | 5/2007 | Stengl et al. |
| 7,276,714 B2 | 10/2007 | Platzgummer et al. |
| 7,459,247 B2 | 12/2008 | Bijnen et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,781,748 B2 | 8/2010 | Platzgummer et al. |
| 7,823,081 B2 | 10/2010 | Sato et al. |
| 8,057,972 B2 | 11/2011 | Fragner et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,294,117 B2 * | 10/2012 | Kruit et al. ............... 250/396 R |
| 8,378,320 B2 | 2/2013 | Platzgummer |
| 8,546,767 B2 | 10/2013 | Platzgummer et al. |
| 8,563,942 B2 | 10/2013 | Platzgummer |
| 9,053,906 B2 | 6/2015 | Platzgummer |
| 2002/0021426 A1 | 2/2002 | Mei et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2004/0058536 A1 | 3/2004 | Ki |
| 2004/0119021 A1 | 6/2004 | Parker et al. |
| 2004/0157407 A1 | 8/2004 | Tong et al. |
| 2004/0169147 A1 | 9/2004 | Ono et al. |
| 2005/0063510 A1 | 3/2005 | Hieronimi et al. |
| 2005/0242302 A1 | 11/2005 | Platzgummer et al. |
| 2005/0242303 A1 | 11/2005 | Platzgummer |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0279768 A1 | 12/2007 | Shibazaki et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0237460 A1 | 10/2008 | Fragner et al. |
| 2008/0257096 A1 | 10/2008 | Zhu et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0256075 A1 * | 10/2009 | Kemen et al. ............... 250/307 |
| 2009/0321631 A1 | 12/2009 | Smick et al. |
| 2010/0127185 A1 | 5/2010 | Fragner et al. |
| 2010/0178602 A1 | 7/2010 | Seto et al. |
| 2010/0288938 A1 | 11/2010 | Platzgummer |
| 2011/0053087 A1 | 3/2011 | Nielsen et al. |
| 2011/0204253 A1 | 8/2011 | Platzgummer et al. |
| 2011/0226968 A1 | 9/2011 | Platzgummer |
| 2012/0076269 A1 | 3/2012 | Roberts et al. |
| 2012/0085940 A1 | 4/2012 | Matsumoto |
| 2012/0211674 A1 | 8/2012 | Kato |
| 2012/0286170 A1 | 11/2012 | Van De Peut et al. |
| 2013/0164684 A1 | 6/2013 | Yamanaka |
| 2013/0252145 A1 | 9/2013 | Matsumoto et al. |
| 2014/0197327 A1 | 7/2014 | Platzgummer |
| 2015/0028230 A1 | 1/2015 | Platzgummer |
| 2015/0069260 A1 | 3/2015 | Platzgummer |

FOREIGN PATENT DOCUMENTS

| | | |
|---|---|---|
| EP | 2187427 A2 | 5/2010 |
| JP | 08213301 A | 8/1996 |
| JP | 2006019436 A | 1/2006 |
| JP | 2006332289 A | 12/2006 |
| WO | 2008053140 A1 | 5/2008 |
| WO | 2009147202 A1 | 12/2009 |
| WO | 2012172913 A1 | 12/2012 |

OTHER PUBLICATIONS

European Search Report for Application No. 09450212.7, Report Dated Sep. 28, 2010, 9 pgs.

European Search Report for Application No. 14177851, Report Dated Oct. 16, 2014; 1 pg.

European Search Report for Application No. 14176645, Report Dated Dec. 1, 2014, 1 pg.

European Search Report for Application No. 08450077.6, Report Dated Jan. 29, 2010, 4 pgs.

European Search Report for Application No. 141501197.7, Report Dated Jun. 6, 2014, 2 pgs.

European Search Report for Application No. 10450070.7, Report Dated May 7, 2012, 13 pgs.

Berry et al., "Programmable aperture plate for maskless high-throughput nanolithography", J. Vac. Sci. Technol., Nov./Dec. 1997, vol. B15, No. 6, pp. 2382-2386.

Disclosed Anonymously, "Multi-tone rasterization, dual pass scan, data path and cell based vector format", IPCOM000183472D, printed from ip.com PriorArtDatabase, published May 22, 2009, 108 pages.

Kapl et al., "Characterization of CMOS programmable multi-beam blanking arrays as used for programmable multi-beam projection lithography and reisitless nanopatterning", Journal of Micromechanics and Microengineering, 21 (2001), pp. 1-8.

Platzgummer et al., "eMET—50keV electron Mask Exposure Tool Development based on proven multi-beam projection technology", Proc. Of SPIE , vol. 7823, 2010, pp. 782308-1-782308-12.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

* cited by examiner

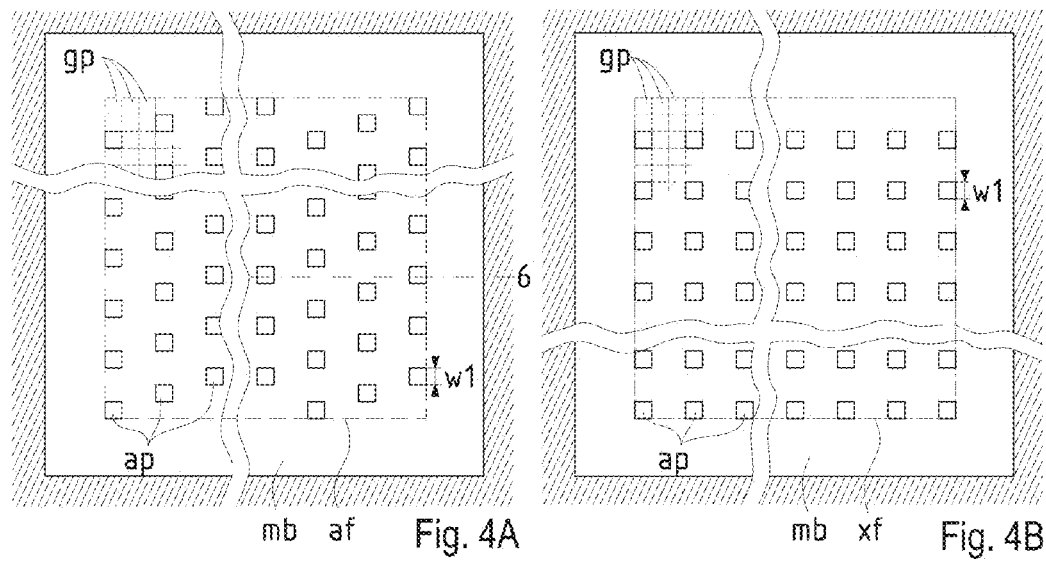
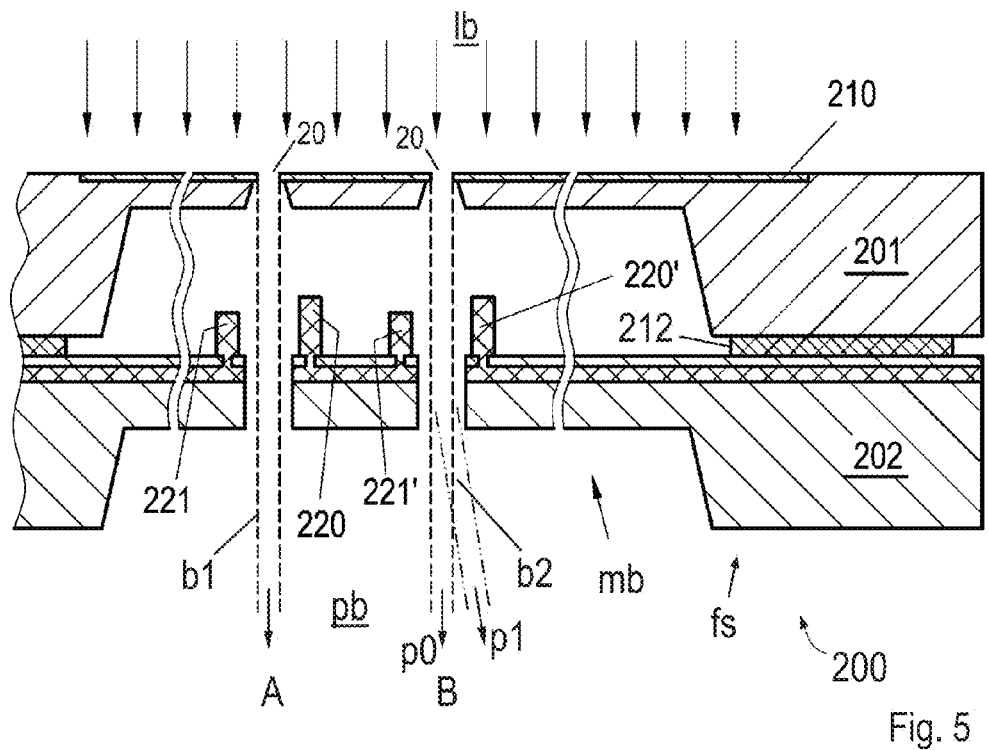

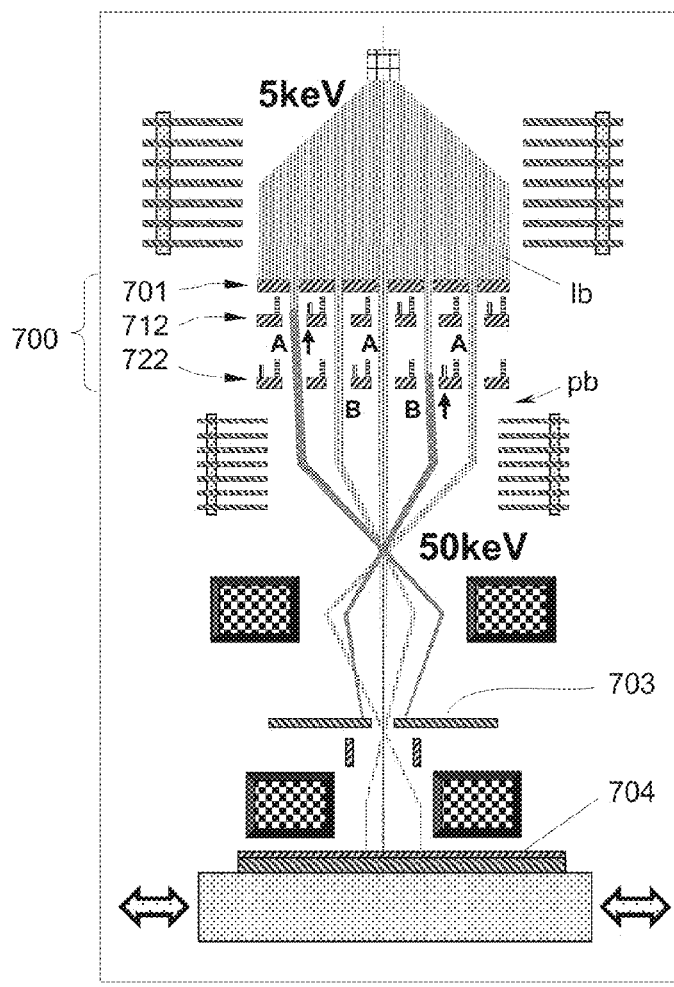
Fig. 7A
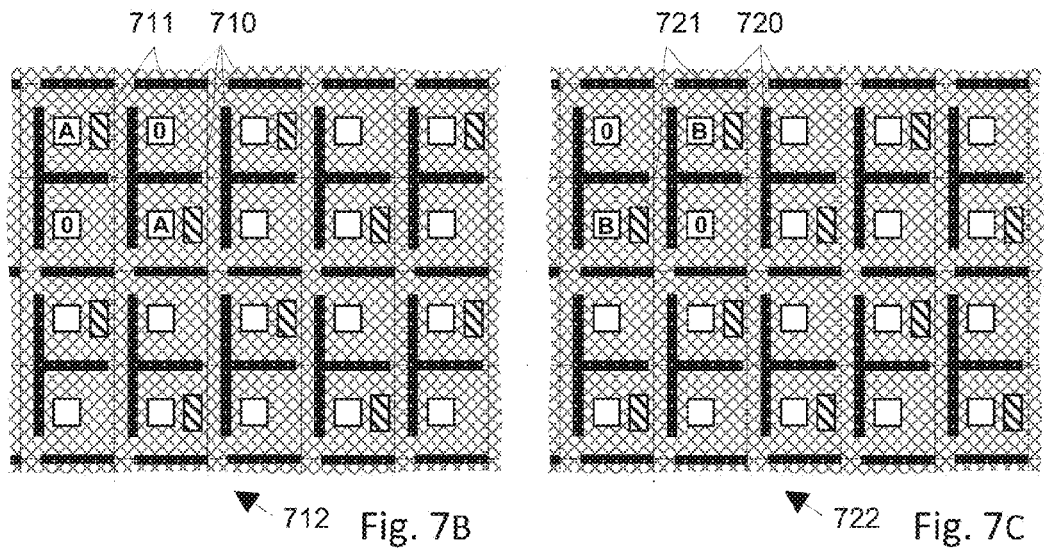
712 Fig. 7B
722 Fig. 7C

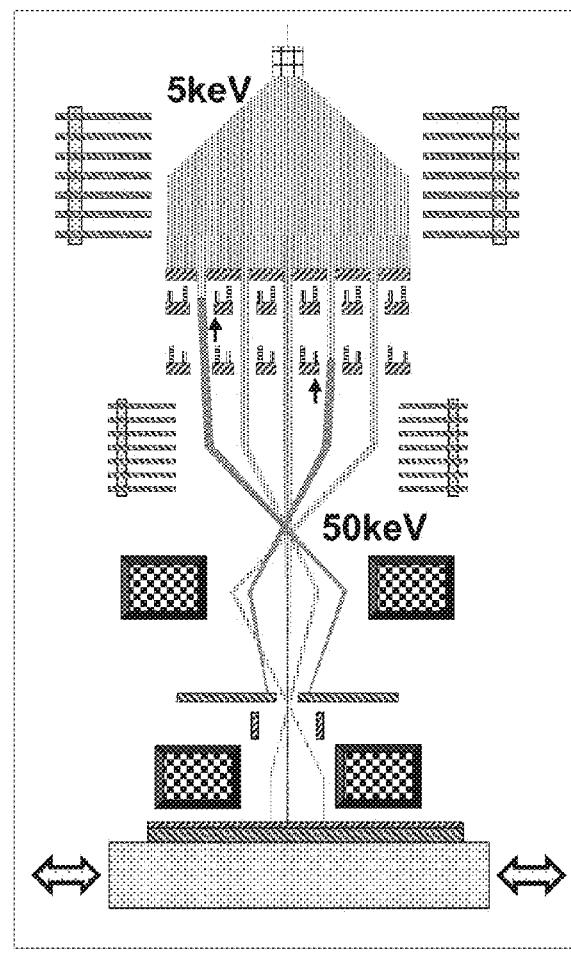
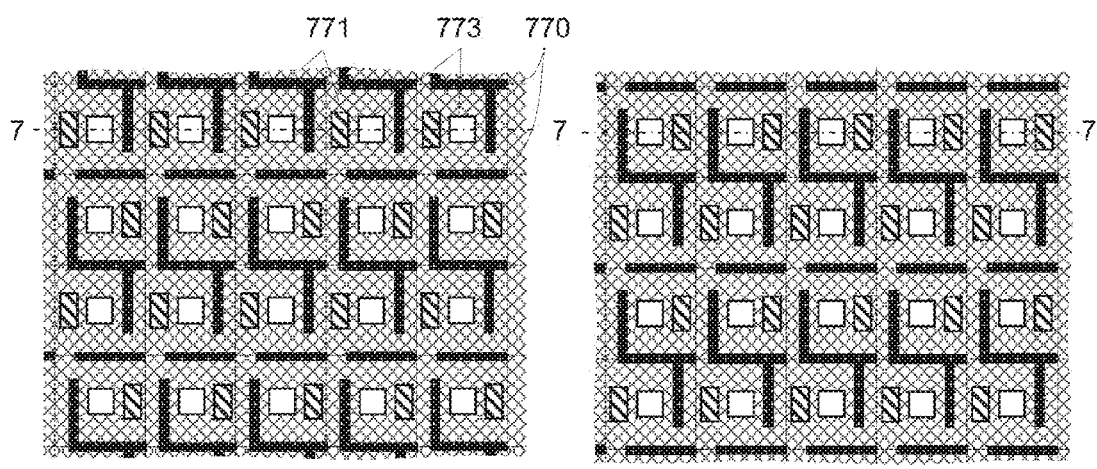
Fig. 10A
Fig. 10B
Fig. 10C

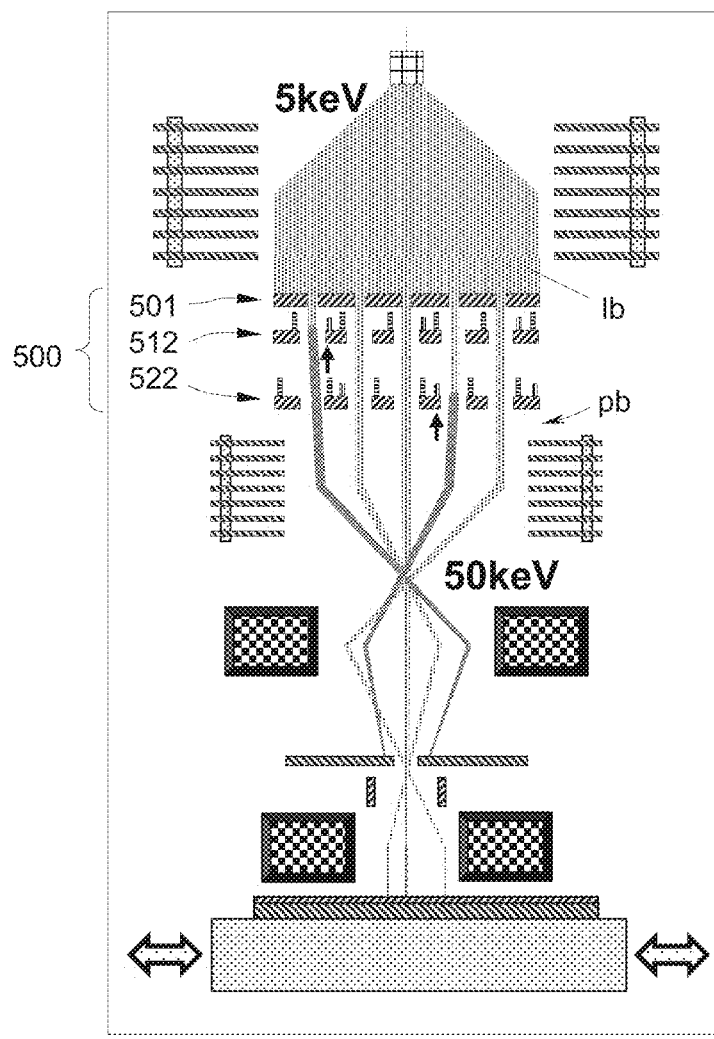
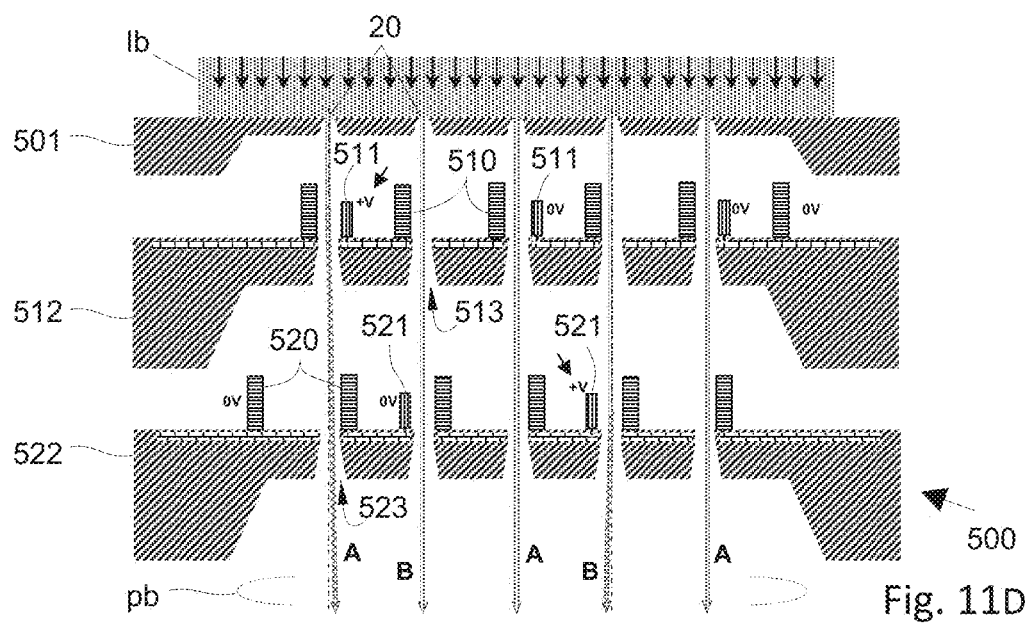
Fig. 11A
Fig. 11D

US 9,099,277 B2

PATTERN DEFINITION DEVICE HAVING MULTIPLE BLANKING ARRAYS

CROSS-REFERENCE TO RELATED APPLICATIONS

The present application claims priority to European Application No. 13176834.3 filed on Jul. 17, 2013, the disclosures of which are incorporated herein by reference in their entirety.

FIELD OF THE INVENTION AND DESCRIPTION OF PRIOR ART

The invention generally relates to an advanced programmable multi-beam pattern definition device for use in a charged-particle multi-beam processing (in particular nanopatterning or semiconductor lithography) or inspection apparatus. Furthermore, many embodiments of the invention relate to a charged-particle multi-beam processing or inspection apparatus (such as a nanopatterning or semiconductor lithography apparatus) including said programmable multi-beam pattern definition device.

A pattern definition (PD) device of this kind usually comprises at least two plates, an aperture array plate and a deflector array plate, also called aperture plate and blanking plate in published literature of the applicant, where the PD device is called programmable aperture plate system.

The aperture array plate is designed to be irradiated with a broad beam of electrically charged particles and allows passage of charged particles through a plurality of apertures; this will form a corresponding number of beamlets, each of the beamlets traversing the aperture along a respective beamlet path.

Positioned in proximity to the aperture array plate, preferably downstream thereof, is the deflector array plate (DAP) with apertures of larger size compared to the size of the openings in the aperture array plate. Thus, the beamlets formed with the aperture array plate, can pass through the DAP freely (i.e., without geometric obstruction). In the DAP the beamlets can be selectively deflected by an amount sufficient to divert said beamlets off their nominal paths, so that the deflected beamlets cannot reach a target, as described in prior publications of the applicant.

A charged-particle multi-beam apparatus with a multi-beam PD device of this kind is disclosed in the U.S. Pat. No. 6,768,125 of the applicant, which is hereby incorporated into the present disclosure as relevant prior art. That patent describes a charged-particle lithography and processing method and apparatus dubbed PML2 (short for "Projection Mask-Less Lithography"), and publications of the applicant describe eMET (short for "electron multi-beam Mask Exposure Tool"), both of which realize a multi-beam writing concept and use a programmable aperture plate system (APS) as PD device for structuring a particle beam, which is extracted from a single source of electrically charged particles. In FIG. 7 of U.S. Pat. No. 6,767,125 it is shown that beams which are deflected in the DAP are filtered out at a third plate ("terminal plate") placed further downstream in proximity of the DAP. As a slightly modified variant thereof, FIG. 1 shows a PD device 102 in which beamlets are formed by an aperture array plate 201 and pass through larger openings in a DAP 202; beamlets deflected in the DAP 202 are filtered out at a stopping plate 17 situated at or near the second cross-over c2 of charged-particle projection optics 103. This has the advantages that a terminal plate in the DAP is not needed, and a significantly smaller deflection angle will be sufficient to accomplish beam blanking in the DAP.

Charged-particle multi-beam lithography and processing is of high interest for nanolithography and nanopatterning applications, such as for multi-beam mask writing and for maskless multi-beam direct write processes on silicon wafer substrates. With regard to the present application the terms 'target' and 'substrate' are used without difference in meaning.

In particular electron multi-beam writing is a promising concept for the future industrial fabrication of photomasks as needed for 193 nm immersion lithography, of EUV-masks for extended ultra-violet lithography (EUVL), and of templates (1× masks) for nano-imprint lithography, in particular for sub-20 nm semiconductor technology nodes, with extendibility to sub-10 nm technology nodes. For the multi-beam mask writer the applicant has coined the acronym eMET (see above). Configurations of multi electron beam direct write (MEBDW) processing on silicon wafers in multi-column PML2 configurations are described in U.S. Pat. No. 7,214,951 and U.S. Pat. No. 8,183,543 of the applicant.

The PD device is, preferably, a programmable multi-aperture device. The implementation of a charged-particle multi-beam projection optical system based on a programmable multi-aperture plate allows a significant improvement of the achievable productivity in comparison with focused single spot beam systems as well as variable shaped beam (VSB) systems. The reasons for the improved productivity are, firstly, the parallelism of the process using a plurality of beams and, secondly, the increased current (of all beamlets writing in parallel) which can be imaged to a substrate at the same resolution. As compared with a single electron beam system, the current density at target of the electron multi-beam writing apparatus (in the order of $A/cm^2$) is lower by approx. two orders of magnitude when compared to VSB systems, thus reducing instantaneous heating effects which are unavoidable when using single beam systems with high ($>100 \text{ A/cm}^2$) current density.

To further explain beamlet switching, FIG. 5 shows the above-mentioned PD device 102, which is basically in conformance with U.S. Pat. No. 6,768,125 and U.S. Pat. No. 7,276,714 of the applicant, in more detail. FIG. 4A (corresponding to FIG. 2 of U.S. Pat. No. 6,768,125) shows a bottom view of the PD device (view direction against the direction of the illuminating beam) with a staggered apertures array, and FIG. 5 (corresponding to FIG. 12 of U.S. Pat. No. 7,714,298) a longitudinal sectional view along line 6 in FIG. 4A. In more implementations, such as those disclosed in U.S. Pat. No. 8,222,621, multi-beam writing at targets is fully accomplished with a non-staggered "orthogonal" array of apertures such as the array shown in FIG. 4B. FIG. 6B shows an exemplary plan view detail of the DAP of FIG. 4B as viewed along the direction of the beam, showing an example layout for ground plates and deflection plates. The area between the DAP openings is used for accommodating the CMOS electronics to control and power the deflection electrodes.

The PD system 102 of FIG. 4A or 4B and FIG. 5 comprises a number of plates 201, 202 which are mounted in a stacked configuration, realizing a composite device whose components serve respective specific functions. Each of the plates is preferably realized with silicon microsystems technology in which the structures have been formed by micro-structuring techniques as outlined e.g. in U.S. Pat. No. 7,687,783 and U.S. Pat. No. 8,198,601. In the configuration shown in FIG. 5, the plates 201, 202 are bonded together at bonding regions 212 in the frame fs by means of known bonding techniques.

In other variants, the plates are mechanically separate and held in their position by adjustable holding apparatus as described for instance in US 2011/0204253 A1 of the applicant. This has the advantage that the aperture array plate is not influenced by positional changes of the DAP. Slight positional changes of the DAP may be tolerated as the DAP has only the purpose to deflect individual beamlets whereas not deflected beamlets are passing through the DAP and are imaged to the substrate.

A plurality of apertures is located in membranes mb formed by thinned regions of silicon wafers usually cut to a smaller quadratic or rectangular format, forming an aperture field, designated by reference symbols af in FIG. 4A and xf in FIG. 4B; the membranes mb are stabilized by the surrounding frame fs (FIG. 5, the frame is shown hatched in FIGS. 4A,B). Each aperture corresponds to a set of consecutive openings which are defined in said plates. The number of apertures visible in FIGS. 4A and 4B is small for the sake of better clarity, to represent a large number of apertures forming the aperture field in the membranes mb; in FIG. 5, only two apertures are shown. The charged particle beam Ib traverses the plates through this array of apertures of the aperture field af.

The first plate in the direction of the incoming beam is an aperture array plate or short aperture plate 201. It absorbs the majority of the impingent charged particle beam Ib, but the charged particles can pass through a number of apertures 20 of defined shape, thus forming a plurality of beamlets, of which only two beamlets b1, b2 are shown. Apart from the task of forming the beamlets, the aperture plate 201 serves to protect the subsequent plate(s) from irradiation damage. In order to avoid local charging the aperture plate may be coated with an appropriate layer 210, usually a metallic layer forming no oxide (e.g. iridium). When using ion beams, the layer 210 and method of its formation are chosen suitably to prevent the irradiating particles to be incorporated in the silicon crystalline matrix, which would cause a change of membrane stress, as outlined in U.S. Pat. No. 6,858,118.

Following the aperture array plate 201 downstream, a deflector array plate 202 (DAP; also referred to as blanking plate in view of its function in the context of the apparatus 100) is provided. This plate serves to deflect selected beamlets and thus to alter their beam path. The DAP has a plurality of so called blanking openings, which each correspond to a respective aperture of the aperture array plate 201. As mentioned above and shown in FIG. 5, the blanking openings in the DAP are larger than the openings in the aperture array plate.

Each blanking opening in the DAP is provided with a beamlet deflection means (also referred to as beamlet deflection device) which allows to individually deflect charged particles transgressing through the opening, thus diverting the beamlet traversing the opening off its path. Each beamlet deflection means includes a set of beamlet deflection electrodes, usually a pair. Preferably, each set has electrodes of different types: a first type are 'ground electrodes', which are applied at the potential of the PD device, whereas another type, which is called here the 'active electrodes', are applied individual potentials in order to deflect the beamlet transgressing the corresponding blanking opening. The ground electrodes may be shared between adjacent beamlet deflection devices. They may be formed so as to have a substantial height over the height of the active electrodes. This is done in order to provide sufficient shielding of the blanking deflection means against cross-talking and other unwanted effects such as lens effects incurred by the deflection electrode geometry.

In the prior-art DAP illustrated in FIG. 5, each beamlet deflection means comprises an active electrode 221, 221' and a ground electrode 220, 220' respectively. The electrodes are for instance free-standing with respect to the DAP base membrane. Such electrodes may be formed by perpendicular growth employing state of the art techniques as for instance electroplating techniques.

For instance, beamlet b1 transgresses the subsequent larger opening of the pattern definition system 102 without being deflected, since the beamlet deflection means formed by the respective set of beamlet deflection electrodes is not energized, meaning here that no voltage is applied between the active electrode 221 and the associated ground electrode 220. This corresponds to the "switched-on" state of the aperture. Beamlet b1 passes the pattern definition system 102 unaffected and is focused by the particle-optical system through the crossovers and imaged onto the target with a reduction as induced by the charged-particle projection optics. For example, in systems implemented by the applicant, a reduction factor as large as 200:1 was realized. In contrast, as shown with beamlet b2, a "switched-off" state is realized by energizing the beamlet deflection means of this aperture, i.e. applying a voltage to the active electrode 221' with regard to the corresponding ground electrode. In this state, the beamlet deflection means formed by electrodes 220',221' generates a local electric field across the path of the corresponding beamlet b2 and thus deflects the beamlet b2 off its normal path p0 to a deflected direction. As a consequence the beamlet will, on its way through the charged-particle optical system, obey an altered path p1 and be absorbed at an absorbing means provided in the optical system, rather than reaching the target. Thus, beamlet b2 is blanked. The beam deflection angle is largely exaggerated in FIG. 5; it is, in general, very small, typically 0.2 to 1 thousands of a radian.

The pattern of switched-on apertures is chosen according to the pattern to be exposed on the substrate, as these apertures are the only portions of the pattern definition device transparent to the beam Ib, which is thus formed into a patterned beam pb emerging from the PD device.

In general the PD device will comprise at least two different kinds of plates for comparably high integration density of apertures and deflectors, namely, at least an aperture plate for forming the beamlets (and possibly absorbing the majority of heat load imposed by the incoming beam) and a deflector array plate (DAP) for selected deflection of beamlets. Accurate alignment between the two or more plates and adequate adjustment towards the direction of the incoming beam is required. This alignment can be accomplished in-situ by means of a configuration as disclosed in US 2011/0204253.

The motivation of many embodiments of the present invention is to increase the number of programmable beams from currently available quantities (approx. 250 thousands) to up to several millions of beams without necessarily changing the lateral size of the PD device and corresponding charged-particle optics. While the described configuration of the PD device works well with several hundreds of thousands of programmable beams in realized multi-beam writing systems of the applicant, the applicant recognized the need for a distinctly enhanced number of programmable beams in a PD device while not incrementing the lateral overall dimensions of the PD device. Achieving this, there is no necessity to change the dimensions of the charged-particle column housing the PD device. For such substantially increased high numbers of programmable beams, the high density of electric components as needed to process the image data (pattern data) within a single DAP is substantial, and the large data rate incurs an enhanced heat production within the DAP. Further, when placing more apertures within a predefined array field area, there is less place for the CMOS circuitry to control and/or power the active deflection plates. Moreover, the input/ output signal lines for a single DAP are limited for a given level of microsystems technology. Therefore, it is desirable to substantially enhance the number of programmable beams for concurrent use at much higher data rate, but at the same time not to enhance substantially the amount of pattern data that is to be processed in a single DAP during an exposure process. Therefore, use of existing MEMS technology will be sufficient to produce the devices needed, without any need for novel, time-consuming and expensive technology enhancements in order to accomplish the much high number of programmable beams.

SUMMARY OF THE INVENTION

In view of the mentioned objectives, it is an object of many embodiments of the invention to substantially enhance the PD device data rate and thus number of programmable beams without significantly enhance the amount of data to be processed within one deflection array device (DAP). Further, there is the aim to improve the spatial resolution so that an enhanced pattern complexity of the image data may be produced on the target.

This object is met by a pattern definition (PD) device of the kind as described at the outset, which includes at least two deflection array plates (DAPs; in general these plates are devices of an overall plate-like shape), which are positioned across said aperture field in a stacked arrangement such that each of the beamlets traverses at least two DAPs, where each deflection array plate has an area that corresponds to the aperture array field and comprises a plurality of blanking openings allowing passage of beamlets through the respective DAP, and a plurality of deflecting devices, each of said deflecting devices being associated with a respective blanking openings and comprising at least one electrostatic electrode, the deflecting devices may be selectively activated and configured to influence, when activated, the beamlets traversing said respective blanking openings so as to deflect said beamlets by an amount sufficient to divert said beamlets off their nominal paths, wherein for each deflection array device the plurality of deflecting devices correspond to respective subsets of the beamlets, such that each DAP is configured to act on only the beamlets belonging to the respective subset of beamlets by selectively deflecting them, while those beamlets that do not belong to the respective subset can traverse the respective DAP without being deflected by the latter; the DAPs of the PD device are configured such that different DAPs act on different subsets of beamlets, while the DAPs taken together are able to act on the entire number of beamlets.

In other words, each DAP is configured for deflecting a predetermined subset of the set of beamlets traversing the respective area in the DAP, the subsets of beamlets of different DAPs) being mutually different.

In one advantageous embodiment of the invention, DAPs of the PD device are configured such that each beamlet which traverses the aperture field is deflectable by at least one of deflecting devices.

In a preferable alternative, the DAPs of the PD device are configured to act on mutually disjunctive subsets of beamlets, with the subsets of beamlets suitably configured such that each beamlet which traverses the aperture field is associated with exactly one of the DAPs, which is thus configured to act on the beamlet by selectively deflecting it. This realizes a configuration of the devices with mutually complementing blanking operation.

In another suitable embodiment of the invention, the sets of beamlets, when projected onto a two-dimensional plane (X-Y plane) perpendicular to a common direction of the beamlet paths (Z direction), are arranged along grids which are mutually interlacing in at least a part of the areas, but preferably over the entire aperture field.

An alternative to the previous embodiment of the invention envisages composing the aperture field from partial areas. In this case, the sets of beamlets, when projected onto a two-dimensional plane perpendicular to a common direction of the beamlet paths, may be arranged in adjacent (preferably, not overlapping) areas which, taken together, cover the entire aperture field.

A suitable implementation of the deflecting devices may comprise electrostatic electrodes which are configured for applying an electrostatic field to the beamlets traversing the respective blanking openings and thus deflecting said beamlets by an amount sufficient to divert said beamlets off their respective nominal paths. Further, the electrostatic electrodes of each of the deflecting devices may comprise at least one deflector electrode and an associated counter electrode, where the counter electrodes are held at an electrostatic potential common to the DAPs. This common potential is often called ground potential but according to the configuration of the charged-particle column optics this potential is off the earth potential which usually is equal to the target potential. In another variant, the electrostatic electrodes of the deflecting devices may comprise at least two electrostatic deflector electrodes which are configured to be supplied with electrostatic potentials of opposite signs, respectively.

In another advantageous embodiment of the invention the electrostatic potentials supplied to the electrostatic electrodes of the deflecting devices may have different values for different deflecting devices. In particular, the values may vary between deflecting devices with regard to the absolute value, and/or with regard to the sign of the electrostatic potentials. Also, the value may be modified as a function of time. The values of the electrostatic potentials are suitably taken with respect to a ground potential or the potential of the respective counter electrode.

BRIEF DESCRIPTION OF THE DRAWINGS

In the following, embodiments of the present invention are described in more detail by means of several exemplary, non-limiting embodiments of the invention, which are illustrated in the drawings which schematically show:

FIGS. 4A,B show bottom plan views of a PD device for producing the primary pixel arrangement of FIGS. 3A and 3B, respectively;

FIG. 5 shows a simplified sectional view of a PD device of FIG. 4A or 4B;

FIG. 7A shows a particle-beam exposure apparatus having a PD device according to a second embodiment of the invention in a longitudinal sectional view;

FIGS. 7B,C show plan views of the two DAPs included in the PD device of the apparatus of FIG. 7A;

FIGS. 10A-C show a further embodiment realizing a deflection of beamlets to different directions by means of deflections devices of different orientations, with FIG. 10A showing a longitudinal sectional view of a particle-beam apparatus including a PD device having two DAPs, and FIGS. 10B,C showing respective plan view details of the two DAPs of the PD device of FIG. 10A;

FIGS. 11A-D illustrate a further embodiment realizing a PD device comprising two DAPs, FIG. 11A showing a longitudinal sectional view of a particle-beam apparatus including said PD device, FIGS. 11B and 11C showing respective plan view details of the two DAPs, and FIG. 11D showing a detail longitudinal sectional view of said DAP;

DETAILED DESCRIPTION OF THE INVENTION

The various embodiments of the invention discussed in the following are based on a development of the eMET-type charged-particle multi-beam exposure apparatus and its pattern definition (PD) system, having a large-reduction projecting system. In the following, first the technical background of the apparatus is discussed as far as relevant to the application, then embodiments of the invention are discussed in detail. It should be appreciated that the invention is not restricted to the following embodiments or the particular layout of PD devices, which merely represent examples of possible implementations of the invention; rather, the invention is suitable for other types of processing systems that employ a particle-beam and a multi-beam patterning as well.

eMET System

Figure 1:
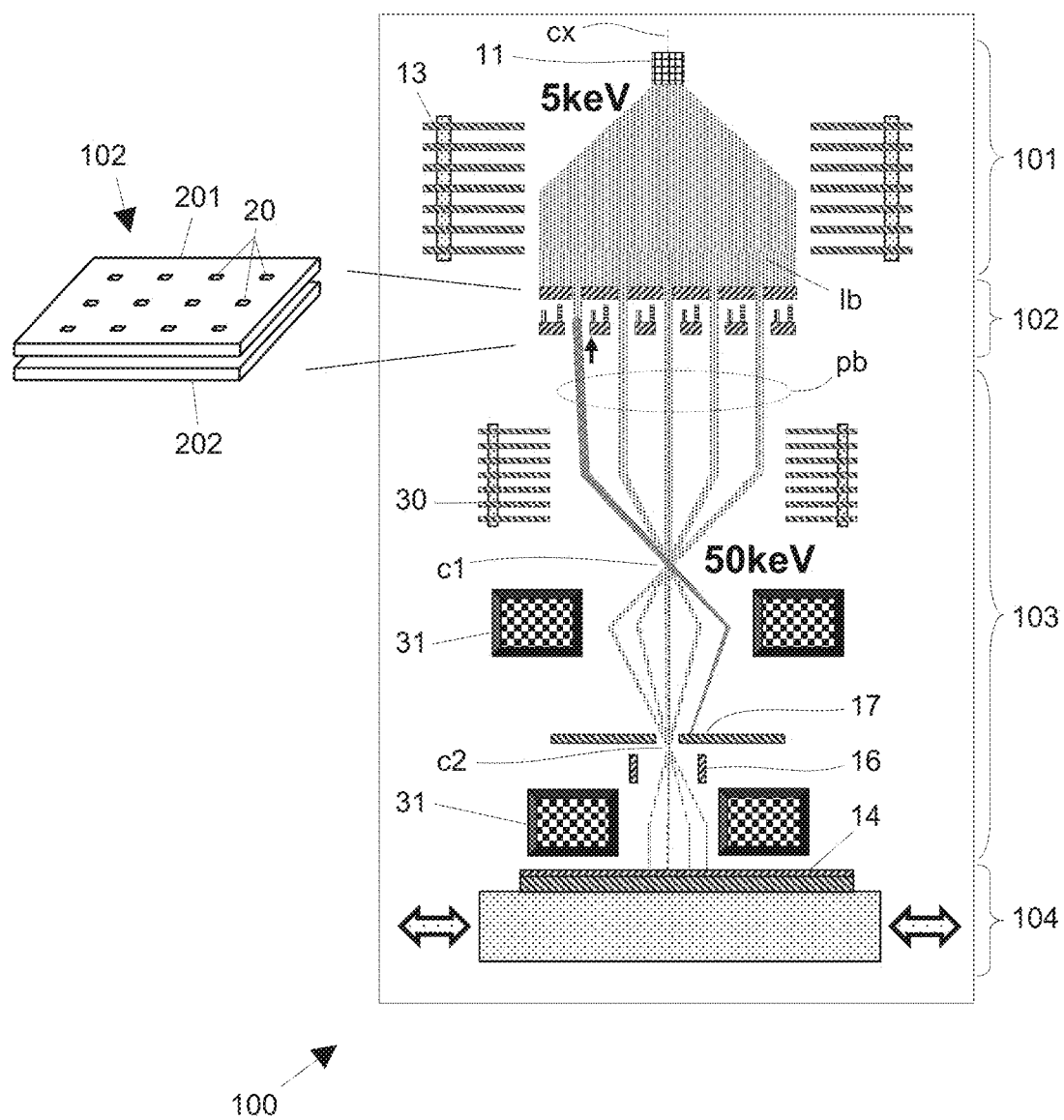
FIG. 1 an overview of a particle-beam exposure apparatus suitable for many embodiments of the invention in a longitudinal section.

A schematic overview of an electron multi-beam mask exposure tool (mask writer) employing an embodiment of the invention is shown in FIG. 1. In the following, only those details are given as needed to disclose embodiments of the invention such that one of ordinary skill in the art can practice the respective embodiments; for the sake of clarity, the components are not shown to size in FIG. 1, particularly the lateral width of the particle beam is exaggerated. Similar to eMET are also the principles of the PML2 system; for more details, the reader is referred to the U.S. Pat. No. 6,768,125 and U.S. Pat. No. 7,781,748, whose teachings with respect to the overall layout of the particle-beam apparatus and the PD means are herewith included by reference.

A suitable source generating an electron beam is used in the eMET system. Equivalent principles apply when using a source for an ion multi-beam tool instead which the applicant also has realized (CHARPAN, short for "Charged-Particle Nanopatterning"). An illumination charged-particle optical system forms the beam into a wide beam which illuminates a PD device having a regular array of apertures in order to define a beam pattern to be projected on a target surface. With each aperture, a small beam (also referred to as 'beamlet') is defined, and the passage of each beamlet through an aperture can be controlled so as to allow ('switch on') or effectively deactivate ('switch off') the passage of particles of the beam through the apertures and/or subsequent demagnifying charged-particle projection optics towards the target. The beamlets traversing the aperture array form a patterned particle beam as represented by the spatial arrangement of the apertures and including information of on-off definitions for the individual beamlets (see below). The patterned beam is then projected by means of a demagnifying charged-particle optical projection system onto the target (for instance, a mask blank or a semiconductor wafer substrate) where an image of those apertures whose corresponding beams are not deflected is thus formed to expose or to modify the target at the irradiated portions. The images formed by the beamlets projected to the substrate is exposed along a straight path ("stripe") on the substrate mechanically moving in one direction; the (large-scale) motion of the substrate is usually achieved by a continuous motion of the target stage, possibly with fine adjustment of the projection system. An additional scanning of the beam in a direction perpendicular to the scanning direction is done only within a small lateral range, for instance to compensate for lateral travel motion errors of the scanning stage and/or to include a (limited) number of parallel pixel rows in the case of specific exposure techniques (cf. below with reference to FIG. 4).

The main components of the apparatus 100 are—in the order of the direction of the beam lb, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an electron or ion source 11, an extractor arrangement defining the location of the virtual source, a general blanker 12 (not shown in FIG. 1), which in the case of using ion beams may also be used as particle filter, and an illumination charged-particle optics realized by a particle optical condenser lens system 13. In the embodiment shown the particle source 11 emits energetic electrons of a suitable kinetic energy such as, e.g., 5 keV; in other implementations, other electrically charged particles such as ions of primarily a certain species may be used, such as hydrogen or $Ar^+$ ions having a defined (kinetic) energy of typically several keV (e.g. 5 keV at the PD system 102) with a comparatively small energy spread of, e.g., $\Delta E=1$ eV. A velocity/energy dependent filter (not shown) may be provided to filter out other, unwanted particle species that may also be produced in the source 11; the filter may also be used to blank out the beam as a whole during repositioning of the beamlets. By means of the condenser lens system 13, the charged particles emitted from the source 11 are formed into a wide-area, substantially telecentric beam serving as beam lb.

The beam lb then irradiates a blanking device which, together with the devices needed to keep its position (not shown), forms the PD device 102 (which is also shown in a schematic perspective detail view at the left-hand side of FIG. 1). The PD device is held at a specific position in the path of the beam lb, which thus irradiates an aperture array pattern formed by a plurality of apertures 20. As already mentioned, each of the apertures can be "switched on" or "off". In a "switched on" or "open" state, an aperture allows the beamlet passing through the respective aperture to reach the target; it is then said, the aperture is transparent to the incident beam. Otherwise, the aperture is "switched off" or "closed", in which case the beam path of the respective beamlet is affected (e.g. by means of deflecting electrodes to which a transverse voltage is applied) in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands; of the beamlets shown, the first from the left is depicted switched off as it is absorbed on a stopping plate 17, which is situated at or near the second cross-over c2 of the charged particle projection optics; the other beamlets, which are switched-on, pass through a central opening of the plate 17 and thus are projected onto the target.

The pattern as represented by the patterned beam pb is then projected by means of a charged-particle optical projection system 103 towards the substrate 14 (such as a 6" mask blank with resist coating); since the beamlets which are switched off are absorbed at the stopping plate 17, only the switched-on beamlets will form an image of the switched-on apertures. The projection system 103 implements a demagnification of, for instance, 200:1, as realized by the applicant. The substrate 14 may be, for instance, in the case of an eMET-type system a 6-inch mask blank or a nanoimprint 1×mask or master template, covered with an electron sensitive resist layer, whereas for a PML2 system the substrate 14 may be a silicon wafer covered with a particle sensitive resist layer. The substrate 14 is held and positioned by a substrate stage (not shown) of the target station 104.

The projection system 103 is, for instance, composed of two consecutive charged-particle optical projector sections with a crossover c1 and c2, respectively. The particle-optical lenses 30, 31 (comprising, for instance, an electrostatic multi-electrode accelerating lens 30 and two magnetic lenses 31) used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector section images the plane of the apertures of the PD device to an intermediate image which in turn is imaged onto the substrate surface by means of the second projector section. Both section employ a demagnifying imaging through crossovers c1,c2; thus, while the intermediate image is inverted, the final image produced on the substrate is upright (non-inverted). The demagnification factor is about 14:1 for both stages, resulting in an overall demagnification of 200:1. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the charged-particle optical system can be found in the above-cited prior art.

As a means to introduce a small lateral shift to the image, i.e. along a direction perpendicular to the optical axis cx, deflection means 16 are provided in one or both of the projector sections. Such deflection means can be realized as, for instance, a multipole electrode system, as discussed in the U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By virtue of the pattern formed in the PD device 102, an arbitrary beam pattern can be generated and transferred to a substrate.

Figure 2:
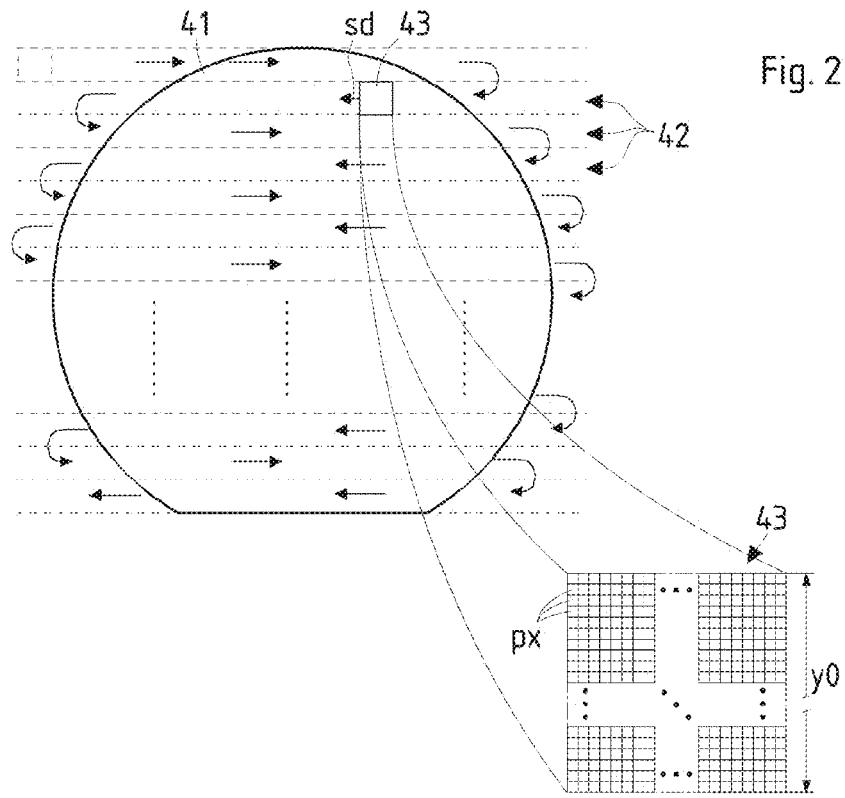
FIG. 2 illustrates one typical writing strategy on a target.

Referring to FIG. 2, the image field mf formed by the PD system 102 on the target, which is, for instance, shown as a resist-covered wafer 41, has a finite size which is usually well smaller than the target itself. Therefore, a scanning stripe exposure strategy is utilized, where the target is moved under the incident beam, so as to change the position of the beam on the target perpetually: the beam is effectively scanned over the target surface. In the embodiment shown, it is the target which effects the (large-scale) movement, so a beam-scanning strategy is not required for the large-scale movement; it is emphasized that for the instant purpose only the relative motion of the image field mf on the target is relevant.

The relative movement of target and beam is realized such that the image field mf is moved over the surface of the target 41 so as to form a sequence of stripes s0 (exposure stripes, also referred to as scan lines). The width of each stripe 42 corresponds to the width y0 of the image field 43 perpendicular to the scanning direction sd. The complete set of stripes covers the total area of the substrate surface. In order to minimize the path length of the movement, the scanning direction sd may alternate from one stripe to the next (boustrophedonal motion). In other embodiments the scanning direction may be the same for all stripes, for instance from the right to the left in FIG. 2, with a quick repositioning of the image from the end of one stripe to the start of the next stripe (at the right). The repositioning between stripes will generally be done using a common blank-out of the beam as described in U.S. Pat. No. 7,781,748 of the applicant.

From the above it will be clear that the image field 43 is composed of a plurality of pattern pixels px. It should be appreciated, however, that only a subset of the pixels px can be exposed simultaneously since only a finite number of apertures is present in the aperture field of the PD system. The pixels which can be exposed simultaneously are hereinafter referred to as primary pixels p1 (see FIGS. 3A and 3B for possible spatial arrangements of primary pixels). It will be appreciated that the primary pixels p1 are the image of the apertures in the PD system, so they reproduce the spatial arrangement of the apertures in the aperture means of the PD system, though at a different scale (because of the demagnification of the optical system). In a sequence of consecutive pixel exposure cycles, the image field 43 is swept over the target (which is achieved by a movement of the target, a movement of the beam, or a proper combination of both) so as to expose all pixels px on the target in successive way.

Figure 3A:
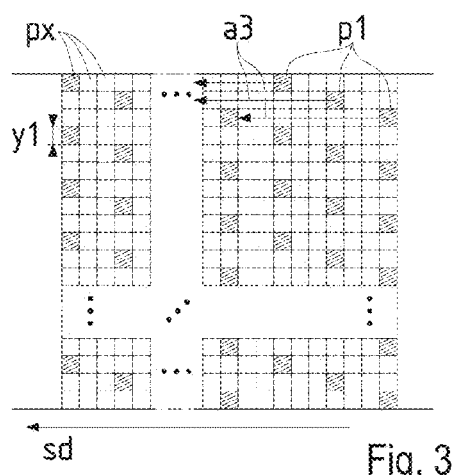
FIG. 3A shows an arrangement of primary pixels that are exposed simultaneously in the image field into staggered lines.

FIG. 3A shows one possible arrangement of a grid of primary pixels p1 within the basic lattice of pattern pixels. The primary pixels p1 are in a staggered grid so in each pixel line (which are the lines parallel to the scanning direction sd) there are the same number of primary pixels p1, and the position of the primary pixels p1 varies from one pixel line to the next, in a typical implementation in a regular manner. The advantage of this layout is that the complete stripe can be exposed by the primary pixels p1 in a sequence of exposures with the target proceeding in a linear motion as illustrated by arrow lines a3. Thus, it is sufficient to move the image field 43 on the target in a linear manner along the scanning direction sd, and the set of primary pixels, as illustrated by the arrow lines for the three primary pixels p1 in the upper right corner, will cover all pattern pixels px without the need of extra movement of the image transverse to the scanning direction.

Figure 3B:
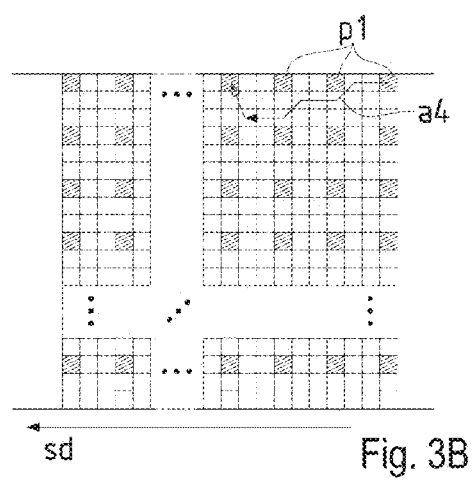
FIG. 3B shows another arrangement of primary pixels according to a orthogonal grid.

FIG. 3B shows another possible arrangement of the grid of primary pixels p1 within the basic pattern pixel lattice, namely, in a regular rectangular grid; in this case, it is a square-like grid ('quad grid') with a 3×3 spacing in the basic lattice. In this case, an additional transverse movement is made during the motion of the image along the scanning direction so the primary pixels p1 can cover all pattern pixel positions px on the target. The transverse movement can be provided, for instance, by the deflection means 16, as exemplarily illustrated by the stepped arrow line a4. After a number of pixels have been exposed in different pixel lines, the movement shifts back to the original pixel line (plus a linear displacement along the direction sd as effected during the time interval lapsed). Thus, the amplitude of the transverse movement can be small; it will be appreciated that the amplitude is in the order of the mutual distance of beamlets (equivalent to the width of a beamlet multiplied by a small number, typically 2 to 8; in FIGS. 3A and 3B, this number is 3; on the target plane, the width of a beamlet is also equivalent to the width y1 of a pixel p1). This variant simplifies the geometric layout of the aperture arrangement in the PD device as compared to a staggered layout as shown in FIG. 3A.

It is further worthwhile to note that in an actual pattern not all pixels are exposed at the full dose, but some pixels will be "switched off" in accordance with the actual pattern; for any primary pixel (or, equivalently, for every beamlet) it can vary from one pixel exposure cycle to the next whether the pixel is "switched on" or "switched off", depending on the pattern to be exposed or structured on the target. For the present application, however, the realization of the actual pattern is irrelevant. Therefore, in the following description, the fact that individual selected beamlets may be switched off is left out of consideration; all beamlets are always shown as switched on (active on the target), as if the pattern exposed is a full cover of the target area. It should be kept in mind that in an actual implementation a pattern will be superimposed which will require that a considerable number of the beamlets will be switched off in the course of irradiation of the target.

PD Device and DAP

FIG. 4A, which is discussed above in detail, shows a plan view of a PD system for producing the pixel grid arrangement of FIG. 3A, and FIG. 5, also discussed above, shows a state-of-the art layout of a PD device 200 with one aperture array plate 201 and one deflection array plate (DAP) 202.

Figure 8A:
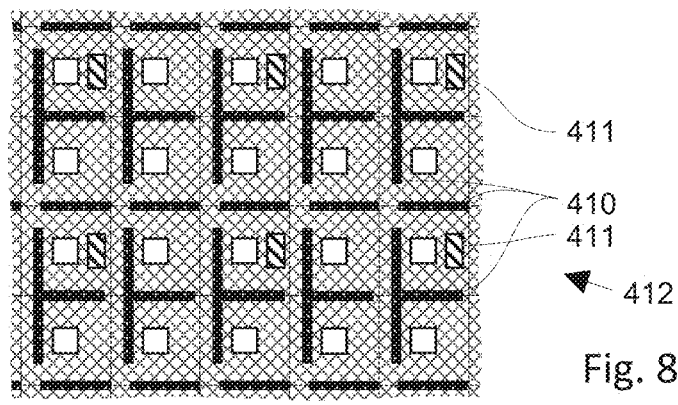
FIGS. 8A-D show, for a PD device according to another embodiment which comprises four DAPs, respective plan views of the four DAPs.
Figure 8B:
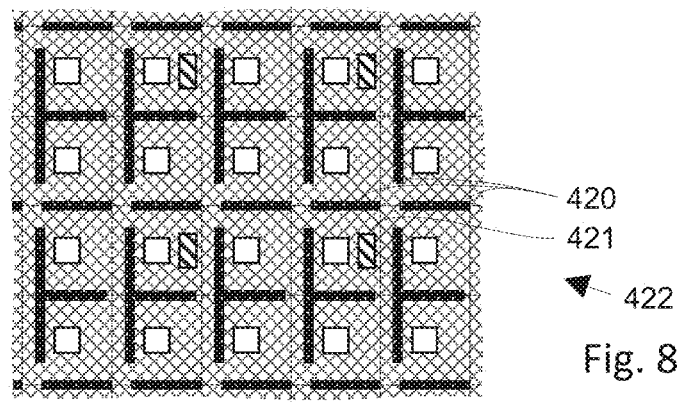
Figure 8C:
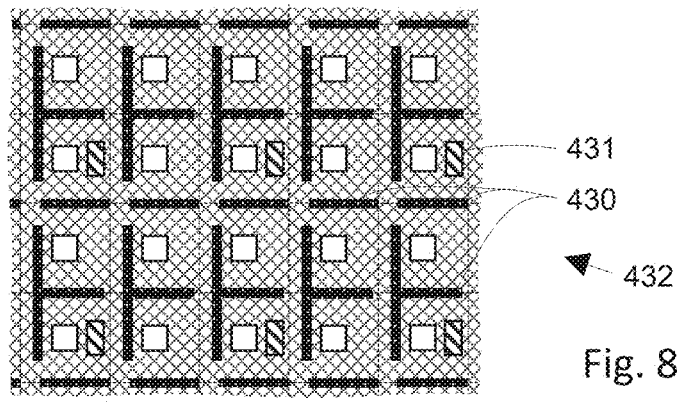
Figure 8D:
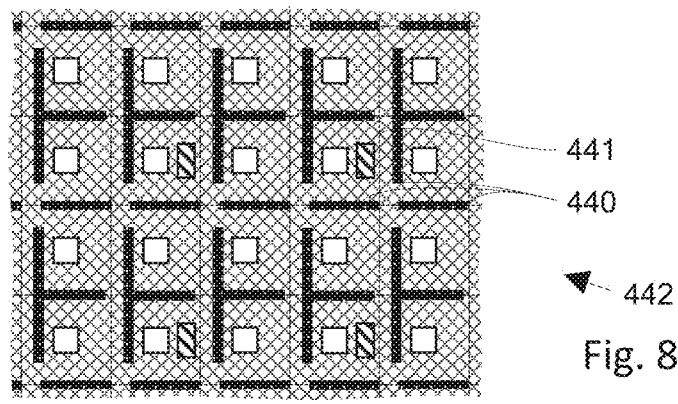

In a like manner, FIG. 4B shows a plan view of a PD system which is designed for producing the pixel grid arrangements of FIG. 3B. In this case, the apertures ap are arranged within an "orthogonal" aperture field xf along a regular rectangular grid. In the embodiment shown in FIG. 3B, the aperture field realizes a regular grid wherein the apertures are spaced in a 3×3 grid, for instance, in which the offset between apertures is 3 times the nominal aperture width w1 along either direction of the grid (consequently, the free space between neighboring apertures is 2·w1). As outlined above FIG. 8A shows a preferred embodiment of a DAP for the case of orthogonal opening arrangement.

Multiple DAPs

According to certain embodiments of the invention, a PD system is provided with more than one DAP, i.e. several DAPs (=the deflection array devices of the claims), which are configured to operate on the plurality of beamlets in a mutually complementary manner. More specifically, the DAPs are provided with functional beam deflection devices only for a part of the beamlets traversing the aperture field of or xf, respectively. More in detail, each DAP is configured such that only a predetermined subset of the openings in its respective area is configured as in the form of blanking opening so that these can be activated for deflecting respective beamlets, such that the deflection array devices are each associated with a corresponding set of beamlets, wherein each deflection array device is able to selectively deflect only the beamlets belonging to the respectively associated set of beamlets, with the sets of beamlets associated with different deflection array devices being mutually different, preferably mutually disjunctive and/or complementary.

Figure 6A:
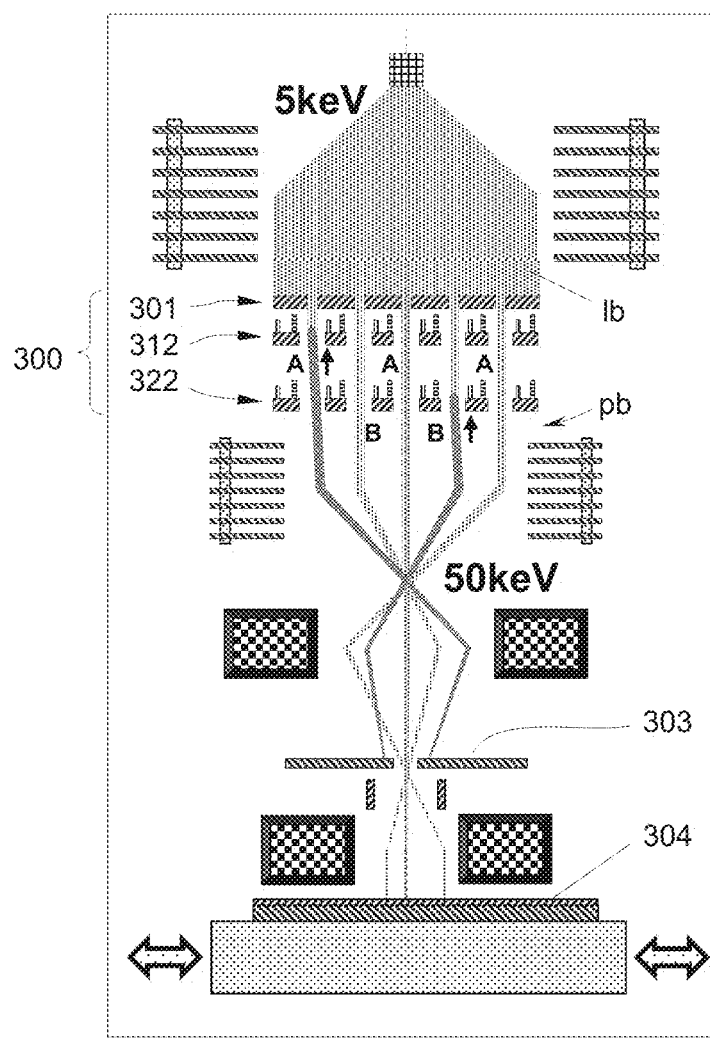
FIG. 6A shows a particle-beam apparatus with a PD device according to a first embodiment of the invention in a longitudinal sectional view.
Figure 6B:
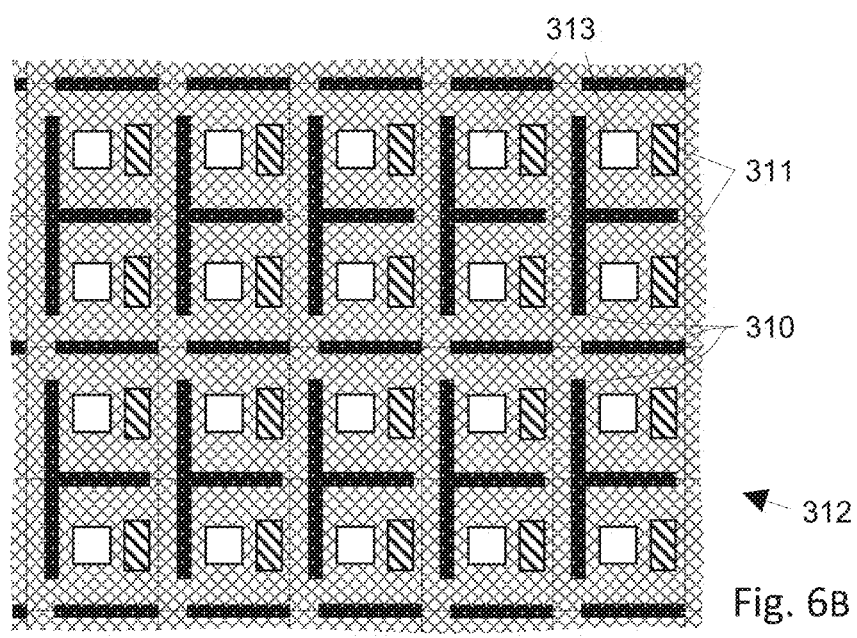
FIG. 6B shows a plan view detail of one DAP of the PD device of FIG. 6A.

FIGS. 6A and 6B illustrate a first embodiment of a PD system 300 according to the invention, comprising an aperture array plate 301 and two DAPs 312 and 322. FIG. 6A shows a longitudinal section of a writing tool apparatus with this PD system 300; only five beamlets are shown to represent the actual large number of beamlets. A detail of a plan view of the first DAP 312 is given in FIG. 6B (the view direction is along the direction of the illuminating beam with any plates above the shown plate removed so as to make visible the electrodes). The plates 301, 312, 322 are either bonded together into a fixed relative position or, preferably, held by positioning devices (not shown) as discussed in US 2011/0204253 A1 of the applicant. Each DAP comprises a complete set of deflection devices for the openings; however, only part of the active electrodes is used for blanking of beamlet. In the first DAP 312, only every second of the openings 313 for the beamlets is configured to be deflected by active electrodes 311, which operate in conjunction with counter ("ground") electrodes 310. Thus, the switching of the group of beamlets marked as A in FIG. 6A, is controlled by means of the first DAP 312 by means of its beamlet deflecting devices. For the other openings in the DAP 312, the electrodes are not used or even disconnected, so there is no deflection of the bemlet in these 'idle' openings. The beamlets which are not in group A form a second group, marked as B in FIG. 6A; switching of the beamlets of this group B is done through the second DAP 322. The second DAP 322 has active and counter electrodes in an arrangement analogous to that of the first DAP 312, but the configuration of activatable deflection electrode pairs is complementary to that of the first DAP. The active electrodes in the second DAP associated with the group-A beamlets are not used or disconnected, so as to render the respective openings 'idle'. For instance, the active electrodes of idle openings may be disconnected from a supply of electrostatic potential or short-cut with the electrostatic potential of the counter electrodes; in another alternative, the electrodes may be deactivated by virtue of a specific programming, for instance in the feeding logic of the DAP (not shown); in other embodiments, which are discussed in detail below, the active electrodes may be omitted for idle openings. Each beamlet is, thus, associated with one of groups A and B, and switching of the beamlet is done through the corresponding DAP 312 or 322, respectively. Thus, the DAP can define a pattern which is to be written on the target 304, by switching on or off the individual beamlets through the respective deflection device. In FIG. 6A arrows mark those active electrodes in the DAPs 311, 312 which are activated so as to effectively switch off the corresponding beamlet. As explained above and illustrated in FIG. 6A, those switched-off beamlets do pass the PD system, but are absorbed at a stopping plate 303 before it would reach the target 304.

The counter (or "ground") electrodes 310 are preferably configured such as to form a grid which forms compartments around each of the openings, so as to suppress cross-talk between the deflecting devices for the beamlets. As can be seen from the plan view of FIG. 6B, the openings 313 are separated by a lattice-like framework constituted by the counter electrodes 310. Thus, each opening 313 is located in a compartment defined by the counter electrodes, such that between two neighboring openings along the X or Y direction, a counter electrode wall is present. Whenever an electrostatic potential is applied to an active electrode 311, establishing a voltage with respect to the electrostatic potential of the counter electrodes, an electric field will establish which extends through the area of the respective opening. This will induce a deflecting effect to any electrically charged particle traversing the opening, resulting in a deflection of a beamlet as mentioned earlier.

The layout of the beamlet deflecting devices in the multiple DAPs 312, 322 may be uniform, or may be different between the DAPs. In the case of the embodiment shown in FIGS. 6A and 6B, the physical layout is uniform, while the distribution to different beamlet groups A, B is done by programming or variations in the circuits which is not visible in FIGS. 6A and 6B.

FIG. 7 illustrates a second embodiment of a PD system 700 according to the invention having an aperture array plate 701 and two DAPs 712 and 722. FIG. 7A shows a longitudinal section of a writing tool apparatus realizing the PD system 700 of this embodiment, while FIGS. 7B and 7C show plan view details of the DAPs 712, 722, respectively. This second embodiment of a PD system 700 corresponds to the first embodiment 300 where not specified otherwise in the following. Each DAP 712, 722 is provided with a complete implementation of the counter electrodes 710, 720, which ensures a good shielding of the beamlets against cross-talk, while in each DAP only a subset of the active electrodes is realized, such that the subsets are complementing each other. Therefore, the first DAP 712 is configured to provide the switching ability for a first group A of the beamlets, and the second DAP 722, for a second group B; these two groups A, B are, preferably, complementary and comprise equal fractions of the entire plurality of beamlets (thus, in this case, complementary halves). Thus, as shown in FIG. 7B, in the first DAP 712 only every second of the openings for the beamlets is provided with deflecting electrodes, which are realized as, for instance active electrodes 711, which cooperate with counter electrodes 710 (alternatively two active electrodes 710, 711 of opposite polarities of voltage may be provided at the relevant sites) serving as beamlet deflecting devices for the respective beamlet. Thus, the switching of the group of beamlets for which deflecting electrodes are provided, marked as A, is controlled by means of the first DAP 712 by means of its beamlet deflecting devices. The remaining beamlets form a second group, marked as B; switching of the beamlets of this group B is done through the second DAP 722 provided with active electrodes 721 (in complementary arrangement to the active electrodes 711 of the first DAP 712) and counter electrodes 720. Each beamlet is, thus, associated with one of groups A and B, and switching of each beamlet is done through the corresponding DAP 712 or 722, respectively, to project the beamlet to either the target 704 or the stopping plate 703, depending on whether it is switched on or off. In FIGS. 7B and 7C, symbols A and B mark openings belonging to beamlets of groups A and B, respectively, whereas a symbol 0 marks idle openings.

FIGS. 8A-D illustrate another embodiment of a PD system, which includes four DAPs 412, 422, 432, 442, beside an aperture array plate (not shown). In this case, only every fourth opening in each DAP is provided with an active electrode 411, 421, 431, 441; the other openings are idle. The layout of counter electrodes 410, 420, 430, 440 is the same for all DAPs.

Deflection to Different Directions, Variable Deflection Amounts

Figure 9:
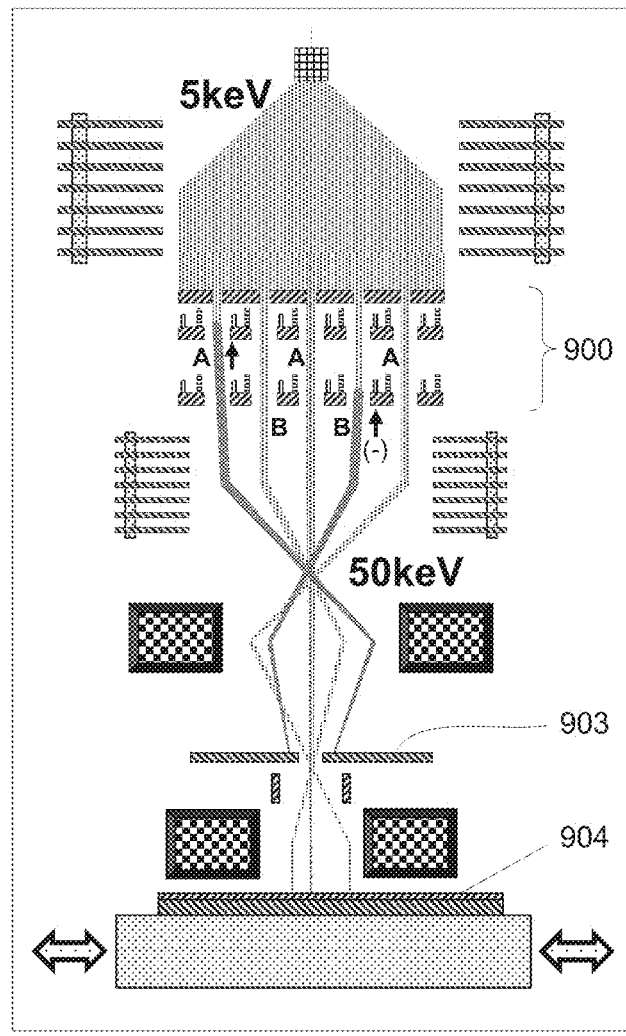
FIG. 9 illustrates how deflection of beamlets to alternating directions may be realized by applying voltages of different signs.

The direction and/or amount of deflection of the beamlets, which is effected by the deflecting devices in the multiple DAPs may be uniform, or may vary from DAP to DAP, or may vary between the deflecting devices within a DAP. For instance, as shown in FIG. 9, the beamlet deflecting devices in the PD system 900 may operate to deflect the beamlet to opposing directions, so the deflection of the switched-off beams of group A is to the left of FIG. 9, whereas the deflection of group-B beamlets is to the right of FIG. 9. The different directions of deflection cause the beamlets which are deflected ("switched off") to be diverted to different regions in the optical system, and thus to different regions where they are absorbed in the absorbing plate 903. This alleviates the irradiation stress imparted to the plate 903 (or any other absorbing components). This will, of course, have no effect to the switched-on beamlets which are imaged onto the target 904. The different direction may be implemented by applying electrostatic voltages of different signs across the respective openings, as indicated in FIG. 9 by symbol (−) for the activated deflection in the second DAP.

Alternatively, as illustrated in the embodiment shown in FIGS. 10A-C, different directions of the deflection can be implemented through different geometric orientation of the beamlet deflecting devices (otherwise, this embodiment corresponds to that of FIGS. 6A and 6B). As can be seen in FIG. 10B (and likewise in FIG. 10C), the deflections means of the openings have alternate orientation when going down in FIG. 10B from one opening to the next, i.e., the active electrodes 771 are located to different sides of the respective opening 773; within a line of openings, the orientation is the same. The configuration of the counter electrodes 770 is uniform. The lines 7-7 in FIGS. 10B,C denote the plane of section corresponding to the sectional view of FIG. 10A. Of course, the skilled person can easily devise other arrangements of the left- and right-oriented deflections, such as according to a checker-board. Different orientations may be to two opposite directions, as shown in FIG. 10B, or to more than two directions. For instance, a four-fold configuration can be envisaged with four DAPs, where the orientation is different for each DAP, for instance to each of the four main lateral directions of the plates (i.e., +X, −X, +Y, and −Y).

Figure 11B:
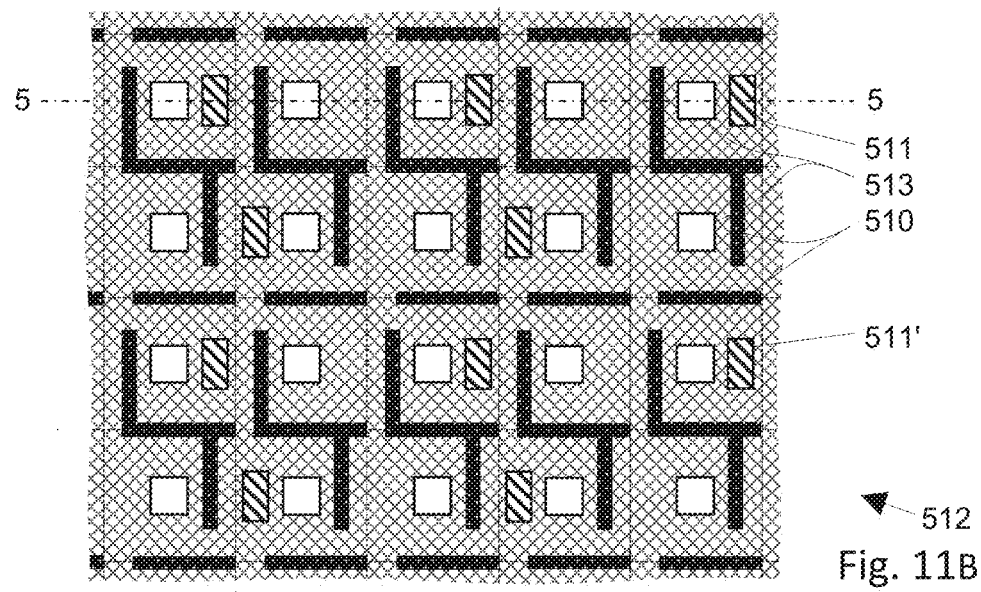

FIGS. 11A to 11D illustrate an embodiment of the invention including a PD device 500 having an aperture array plate 501 and two DAPs 512, 522 where the active electrodes are only realized for half of the beamlets, respectively, and with alternating orientations of deflection. FIG. 11A is a longitudinal section of the PD device 500 including an aperture array plate 501 and two DAPs 512, 522, and FIGS. 10B and 10C show plan view details of the two DAPs 512, 522 (again with view direction along the direction of the illuminating beam with any plates above the shown plate removed so as to make visible the electrodes). FIG. 11D shows a detail sectional view of the PD system 500, along a sectional plane as indicated by line 5 in FIGS. 10B and 10C; again, the figure is simplified to show the range of only five beamlets. As can be seen in FIG. 11D, the orientation of the deflection devices is different for the two DAPs 512, 522. Moreover, as visible in FIGS. 11B and 11C, the orientation also alternates when going from one line of openings to the next.

Each DAP 512, 522 is provided with a complete implementation of the counter ("ground") electrodes, which ensures a good shielding of the beamlets against cross-talk, while in each DAP only a subset of the active electrodes is realized, such that the subsets are complementing each other. The first DAP 512 is configured to provide the switching ability for group A of the beamlets, and the second DAP 522, for second group B.

Figure 11C:
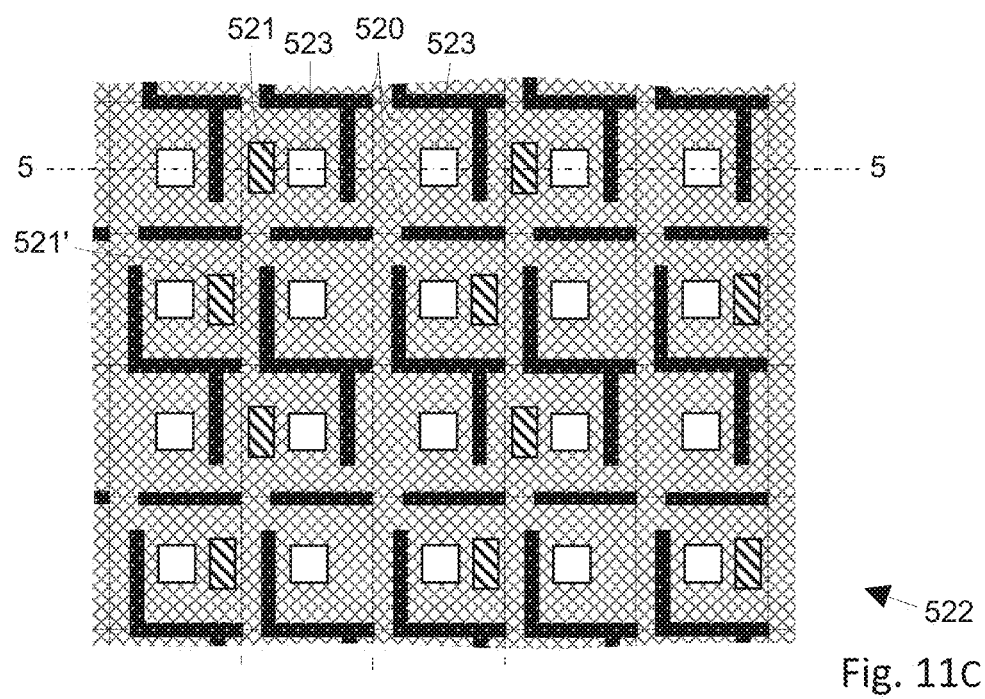
Figure 12A:
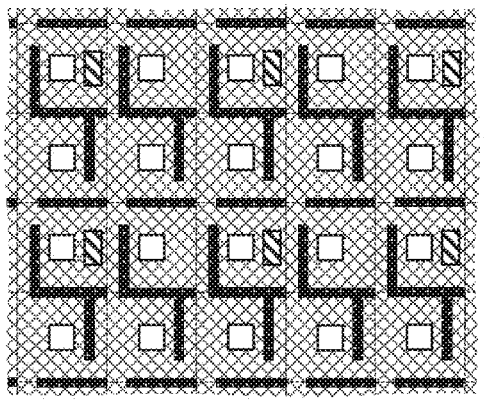
FIGS. 12A-D show, for a PD device according to a variant of the embodiment of FIGS. 11A-D, respective plan view details of the four DAPs.
Figure 12B:
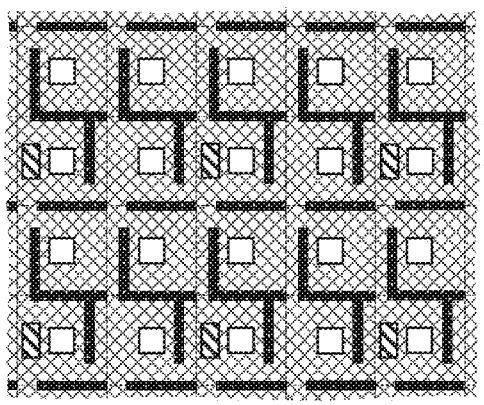
Figure 12C:
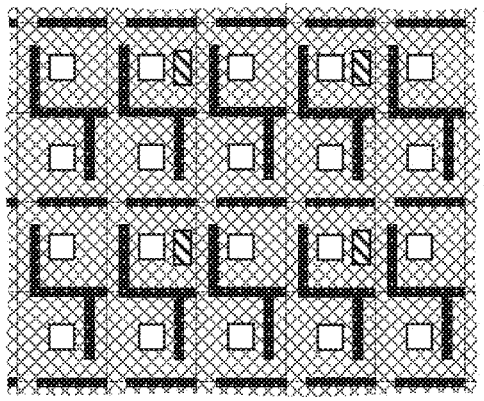
Figure 12D:
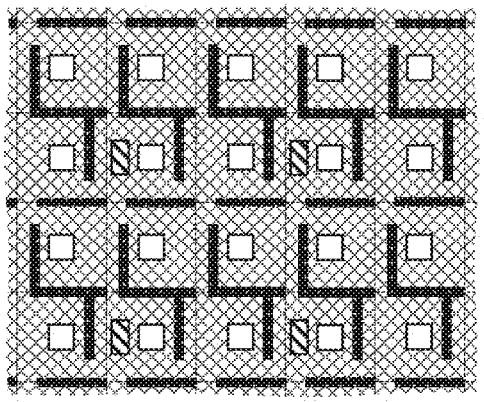

Referring to FIGS. 11B,C, also in this embodiment the openings 513 are separated by a lattice-like framework constituted by the counter electrodes 510. Thus, each opening 513 is located in a compartment defined by the counter electrodes, such that between two neighboring openings along the X or Y direction, a counter electrode wall is present. Further, every second opening 513 is provided with a active electrode 511 located next to the opening with the respective compartment. The plan view of the second DAP 522 shown in FIG. 11C is basically the same as that of the first DAP 521 shown in FIG. 11B, with the exception that the distribution of the active electrodes 521 is different, in particular, complementary. Otherwise, the configuration of openings 523 and the lattice-like framework formed by counter electrodes 520 conforms to those of the first DAP 512.

It is worthwhile to note that the position of the active electrodes 511, 521 with regard to the respective openings 513, 523 is alternating from row to row within each DAP, but is congruent between the first and second DAPs.

In a further aspect of varying the electrostatic potentials, the values of the voltages applied to the active electrodes (taken with reference to a common ground potential or to the respective counter electrode) may have different (absolute) values when the respective electrodes are activated. For instance, in FIG. 11B,C the active electrodes 511, 511', 521, 521' of different lines of openings may be associated with different voltage values, where the individual values used can be similar but vary by an amount of up to, e.g., 20 to 30% from a 'standard' blanking voltage. A variable deflection may, for instance, offer directing the places of absorption of the switched-off beamlets to different regions on the stopping plate. The modification of the value of voltage may be fixed or variable in time, or may be controlled depending on the pattern which is imaged.

In other arrangements, the voltages may be modified or tuned, with regard to their value and/or their sign, as a function of the distance of the opening from the optical axis cx or other geometrical parameters across the aperture field af, xf. This offers an additional tuning parameter for compensating particle-optical imaging errors (for the switched-on beamlets) through the space charge of the switched-off beamlets.

FIGS. 12A to 12D illustrate a variant to the embodiment of FIGS. 11A-D, but comprising four DAPs 612, 622, 632, 642. In each of the DAPs only every fourth opening is provided with active electrodes, thus realizing a working beamlet deflection device for those beamlets only on the respective DAP. In the example shown, this is realized by having only every second opening in every second row equipped with a respective active electrode; thus, each DAP has every second row of openings completely free of active electrodes. The four DAPs are arranged in a manner that the distribution of the active electrodes (or more generally, beamlet deflection devices) is complementary, so for each beamlet there is exactly one active electrode, which is located in one of the DAPs. As a particular example, the pattern of openings provided with an active electrode is that (only) in every second line (only) every second opening is provided with an active electrodes, which may be called a 2×2 order; in each of the four DAPs involved, another one of the four openings in the 2×2 order is provided with such active electrode. Of course, other multiple DAP sets may use other types of order beside 2×2 and 1×2, such as 1×3, 1×4, 2×3, etc.

Counter Electrodes Surrounding Passive Openings

Figure 13A:
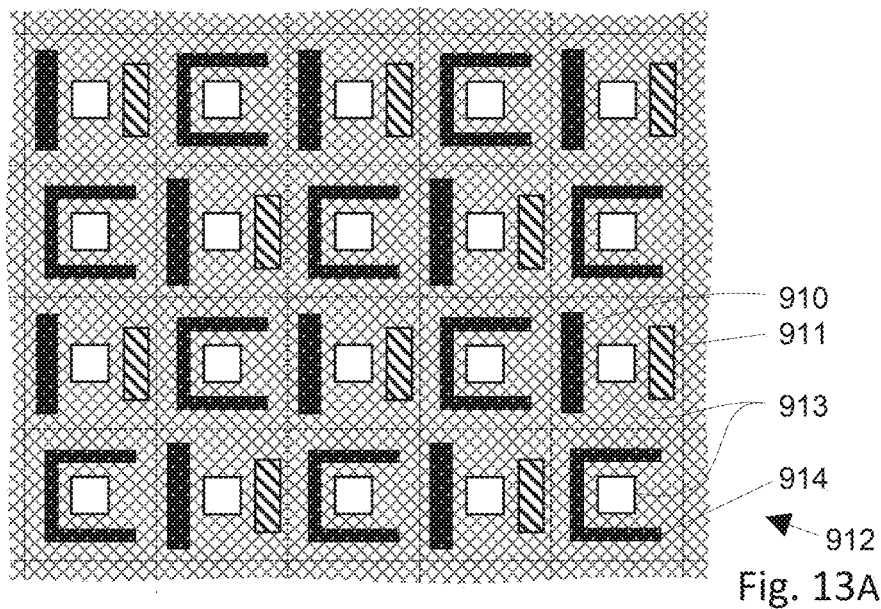
FIGS. 13A,B show respective plan view details of two DAPs of a further embodiment.
Figure 13B:
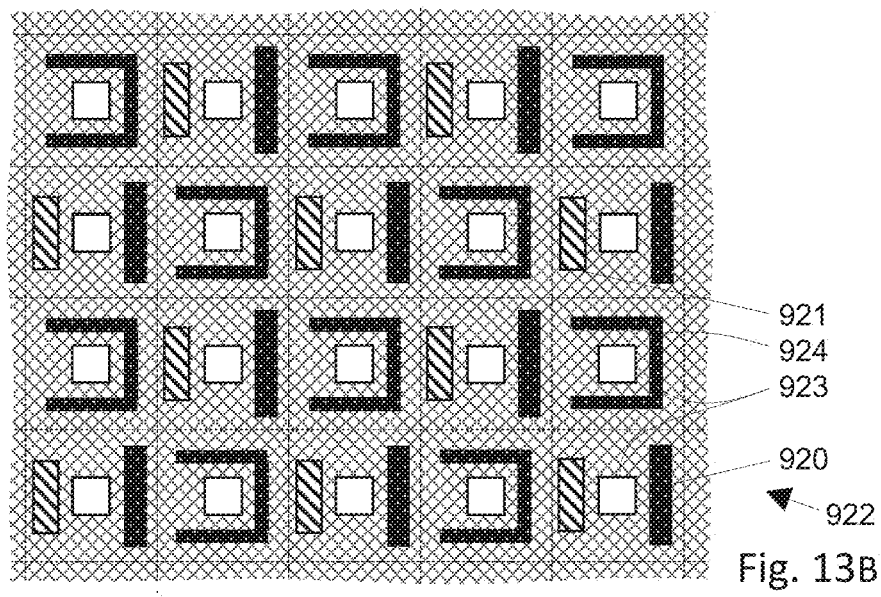
Figure 14A:
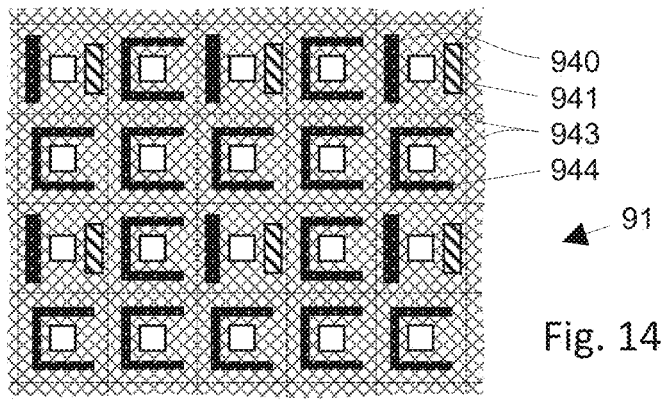
FIG. 14A-D show respective plan view details of four DAP of still another embodiment.
Figure 14B:
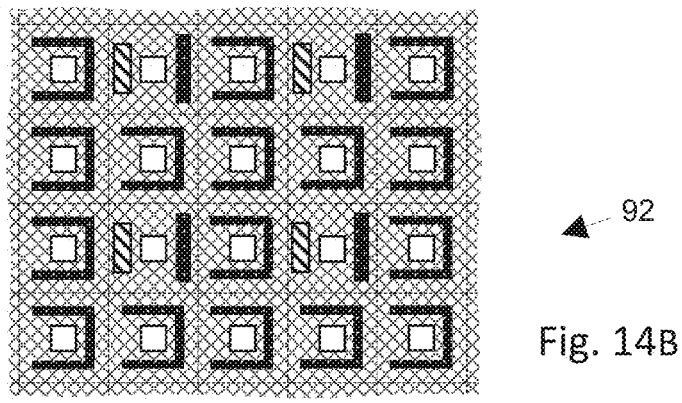
Figure 14C:
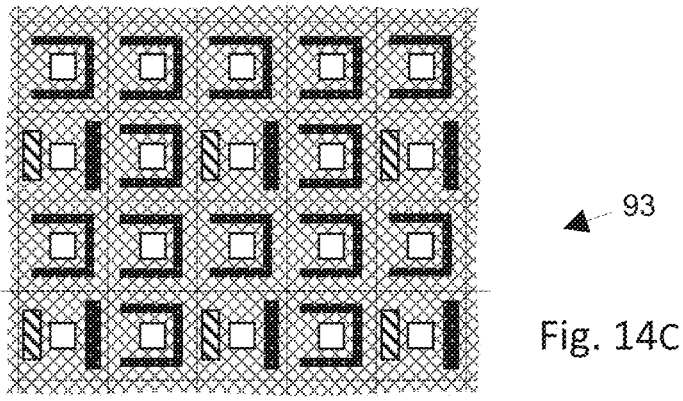
Figure 14D:
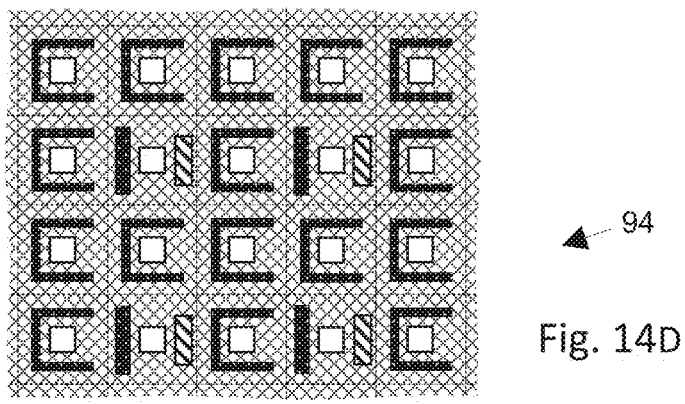

FIGS. 13A and 13B illustrate a set of DAPs 912, 922 pertinent to another embodiment of a PD system having two DAPs having a further improved configuration of counter electrodes for further reducing cross-talk effects. In each of the DAPs 912, 922, only every second of the openings 913, 923 is provided with a working beamlet deflecting device, which in this case is formed by two electrodes 910+911, 920+921 located at opposite sides of the respective opening 913, 923; the mentioned electrodes working as a counter electrode 910, 920 and active electrode 911, 921, respectively. The distribution of the openings provided with beamlet deflecting devices is, for instance, according to a chess-board type pattern, with the two pattern being complementary for the two DAPs. For the other, idle openings, electrodes 914, 924 are provided which surround the respectively corresponding openings on at least three sides so as to shield the openings from the influence of electric fields from neighboring deflecting devices. These electrodes 914, 924 are suitably kept at a uniform electrostatic potential, preferably the ground potential of the counter electrodes. This configuration offers a layout of electrodes which is mechanically more stable and will have improved performance by more effectively avoiding cross-talk. In a variation, the electrodes 914, 924 may surround the respective openings on four sides and/or be joined with counter electrodes 910, 920.

FIGS. 14A-D illustrate the electrode layout of a four-DAP configuration, with four DAPs 91-94. In this case every fourth opening 943 is provided with a beamlet deflecting device constituted by counter and active electrodes 940, 941, respectively; the other ¾ of the openings (i.e., the idle openings) are again shielded off by means of a shield counter electrode 944. The pattern of openings provided with such beamlet deflecting device is according to partition into a 2×2 order, where in each of the four DAPs involved, another one of the four openings in the 2×2 opening group is provided with such beamlet deflecting device.

In the embodiments illustrated in FIGS. 6-14 the areas in which non-idle openings are provided, are mutually interlacing for the number of DAPs belonging to one PD system. It is recalled that non-idle openings are those openings where a working deflection device is present and/or configured. Preferably, the non-idle openings are arranged along grids, and the grids of the different DAPs of a PD device are mutually interlacing over the aperture field, since the areas spanned by the non-idle openings are substantially equal (namely, except for a small number of openings at the edge of the areas).

DAPs Having Adjacent Active Areas

Generally, within many embodiments of the invention, generally, the range of overlap of the areas spanned by the non-idle openings may extend to only parts of the aperture field, or there may be no overlap at all, as illustrated in the following embodiment.

Figure 15:
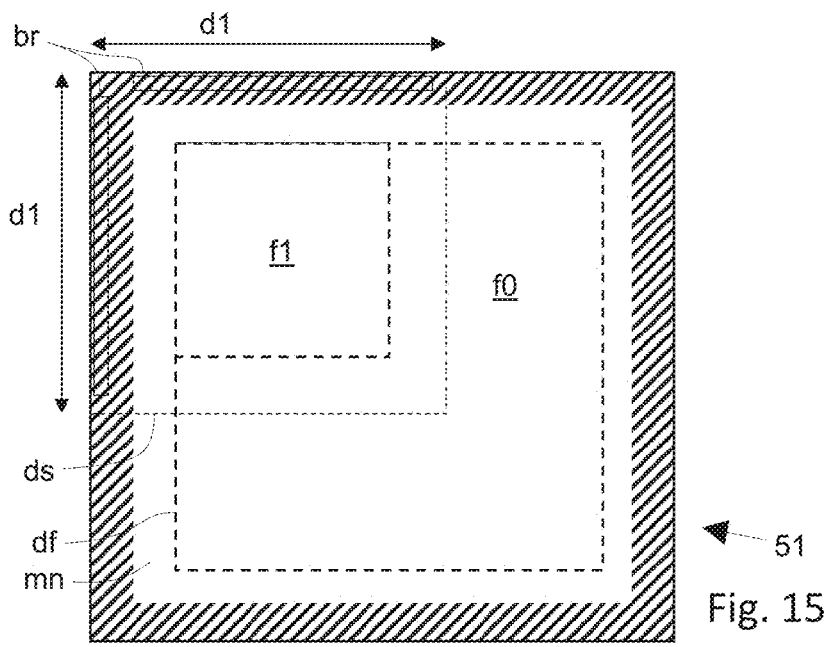
FIG. 15 shows a plan view of a DAP of a further embodiment wherein the active area of blanking is restricted to a part of the aperture field.

FIG. 15 illustrates a DAP 51 which is part of a four-DAP PD device. In a like manner as with other embodiments and in particular in relation to FIG. 5, the area df corresponding to the aperture field of this DAP 51 is formed on a membrane mn held within a frame, shown hatched in FIG. 15, of a plate-like device, which e.g. is produced from a semiconductor wafer. The area df contains non-idle openings only in one quarter, denoted as f1 in FIG. 15 ('active area'). The remaining area f0 ('idle area') of the area df contains only idle openings. The configuration of deflection electrodes in the active area f1 can be, for instance like the one shown in FIG. 6B, but with all active electrodes 311 configured as operative, so as to form non-idle deflection devices. In the idle area f0 all openings are of the idle type; preferably, no active electrodes are present in this region, and also the counter electrodes may be omitted; in addition the size of the idle openings within the idle area f0 may be larger to facilitate passage of the beamlets.

Figure 16:
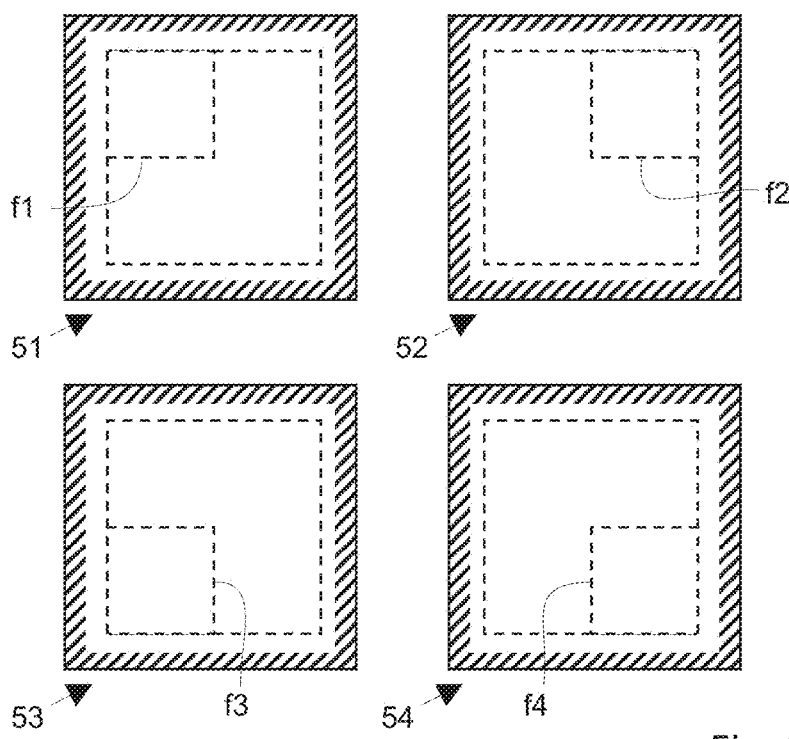
FIG. 16 shows plan views of the four DAPs corresponding to the embodiment of FIG. 15.

FIG. 16 shows the layout of the four DAPs 51-54 of this embodiment. In each of the DAPs the respective active area f1, f2, f3, f4 is located differently, in this case in each of the four quarters of the total area df. (The layouts of the four DAPs correspond to each other by mirror reflection or rotation by 90°.) Taken together, the areas f1-f4 cover the complete area, so as to provide for a complete blanking functionality for all beamlets of the particle beam traversing the DAPs.

This type of arrangement of the areas of non-idle openings is particularly advantageous where the size of the area df in the membrane mn of the DAPs is larger than the size dl of a die area ds (or scanner field size) which can be patterned in established structuring methods. The die area ds to fabricate circuitry is typically 24 mm×32 mm or smaller, and has to include the deflector devices array with high-speed switching function and bumps for packaging. Therefore, the usable size of the blanking array size may be limited by scanner size. The approach illustrated in FIGS. 15 and 16 allows to circumvent this limitation by distributing the area df of the aperture field onto a number of partial areas f1-f4. With reference to the example of the DAP 51 shown in FIG. 15, the active area is formed within a single area of a die field ds of a wafer from which the DAP 51 is produced, and neighboring dies on the wafer will be sacrificed to form the parts lying outside this die field ds, including the larger portion of the idle area f0. In order to provide for electric supplies and electronic control lines for the control circuitry of the deflection devices within the active area f1, electric bonds for the DAP 51 may suitably be provided within one or more regions br formed in the frame along one or both outer edges of the die area ds. These electric bond regions br may, for instance, include a plurality of electric bonding pads (not shown).

Further Variants

It will be clear to the person skilled in the art that the embodiments of the invention disclosed here are only exemplary and are not to be construed as limiting the invention. Rather, the skilled person will readily find modifications and additions which come within the spirit and scope of the invention as described in the attached claims.

Also it is notable that the deflection of the beams may be in +X, −Y, +Y, −Y direction and thus also other arrangements can be designed to optimize a minimization of global space charge effects in the charged-particle projection optics following the PD device.

Further, PD devices with multiple DAPs can also be designed by using DAPs containing all deflection electrodes, i.e. for instance of the design shown in FIG. 8A. The advantage in this case is that the voltage in one DAP may be lowered, as all DAPs together provide the required beamlet deflection amount. Though, there is low likelihood that such an arrangement is chosen as one of the decisive advantages of using multiple DAPs is to gain more area for the CMOS circuitry to power the deflection electrodes.

The invention claimed is:

1. A pattern definition device for use in a charged-particle multi-beam processing or inspection apparatus, said device comprising an aperture field being adapted to be irradiated with a beam of electrically charged particles and allow passage of the beam through a plurality of apertures forming a corresponding number of beamlets, each of the beamlets traversing the aperture field along a respective beamlet path through the pattern definition device and extending downstream of the pattern definition device to a respective nominal path for each beamlet, said pattern definition device including at least two deflection array devices, which are positioned across said aperture field in a stacked arrangement such that each of the beamlets traverses at least two deflection array devices, each deflection array device having an area corresponding to the aperture field, said area comprising a plurality of blanking openings allowing passage of beamlets through the respective deflection array device, and a plurality of deflecting devices, each of said deflecting devices being associated with a respective blanking opening and comprising at least one electrostatic electrode, the deflecting devices being selectively activatable and configured to influence, when activated, the beamlets traversing said respective blanking openings so as to deflect said beamlets by an amount sufficient to divert said beamlets off their nominal paths, wherein for each deflection array device, the plurality of deflecting devices correspond to respective subsets of the beamlets such that each deflection array device is configured to act on only the beamlets belonging to the respective subset of beamlets by selectively deflecting them while allowing the beamlets not belonging to the respective subset to traverse the respective deflection array device without deflection, different deflection array devices of the pattern definition device being configured to act on different subsets of beamlets, while the deflection array devices taken together are able to act on the entire number of beamlets.

2. The pattern definition device of claim 1, wherein deflection array devices of the pattern definition device are configured to act on mutually disjoint subsets of beamlets, wherein the subsets are configured such that each beamlet which traverses the aperture field is associated with exactly one of the deflection array devices, which is thus configured to act on the beamlet by selectively deflecting it.

3. The pattern definition device of claim 1, wherein deflection array devices of the pattern definition device are configured such that each beamlet which traverses the aperture field is deflectable by at least one of deflecting devices.

4. The pattern definition device of claim 1, wherein the sets of beamlets, when projected onto a two-dimensional plane perpendicular to a common direction of the beamlet paths, are arranged along grids which are mutually interlacing in at least a part of the areas.

5. The pattern definition device of claim 1, wherein the sets of beamlets, when projected onto a two-dimensional plane perpendicular to a common direction of the beamlet paths, are arranged in adjacent areas that combine to cover the entire aperture field.

6. The pattern definition device of claim 5, wherein said areas are not overlapping.

7. The pattern definition device of claim 1, wherein the deflecting devices comprise electrostatic electrodes configured for applying an electrostatic field to the beamlets traversing the respective blanking openings and thus deflecting said beamlets by an amount sufficient to divert said beamlets off their respective nominal paths.

8. The pattern definition device of claim 7, wherein the electrostatic electrodes of each of the deflecting devices comprise at least one deflector electrode and an associated counter electrode, the counter electrodes being held at an electrostatic potential common to the deflecting devices.

9. The pattern definition device of claim 7, wherein the electrostatic electrodes of each of the deflecting devices comprise at least two electrostatic deflector electrodes which are configured to be supplied with electrostatic potentials of opposite signs, respectively.

10. The pattern definition device of claim 7, wherein electrostatic potentials supplied to the electrostatic electrodes of the deflecting devices have different values for different deflecting devices, wherein the values are modified with regard to at least one of the absolute value, the sign of the electrostatic potentials, and a function of time.

11. Particle-beam processing or inspection apparatus comprising a multi-beam pattern definition device according to claim 1.

12. The pattern definition device of claim 1, wherein the sets of beamlets are arranged along grids which are mutually interlacing in an area corresponding to the entire aperture filed when the sets of beamlets are projected onto a two-dimensional plane substantially perpendicular to a common direction of the beamlet paths.

* * * * *